United States Patent
Cook et al.

(10) Patent No.: US 10,861,763 B2
(45) Date of Patent: Dec. 8, 2020

(54) THERMAL ROUTING TRENCH BY ADDITIVE PROCESSING

(71) Applicant: Texas Instruments Incorporated, Dallas, TX (US)

(72) Inventors: Benjamin Stassen Cook, Rockwall, TX (US); Archana Venugopal, Dallas, TX (US); Luigi Colombo, Dallas, TX (US); Robert Reid Doering, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 31 days.

(21) Appl. No.: 15/361,397

(22) Filed: Nov. 26, 2016

(65) Prior Publication Data
US 2018/0151464 A1     May 31, 2018

(51) Int. Cl.
*H01L 23/34* (2006.01)
*H01L 23/495* (2006.01)
(Continued)

(52) U.S. Cl.
CPC .......... *H01L 23/367* (2013.01); *H01L 21/324* (2013.01); *H01L 21/32051* (2013.01);
(Continued)

(58) Field of Classification Search
CPC ......... H01L 21/32051; H01L 21/32055; H01L 21/324; H01L 21/76895; H01L 23/3735;
(Continued)

(56) References Cited

U.S. PATENT DOCUMENTS

| | | |
|---|---|---|
| 5,224,030 A | 6/1993 | Banks et al. |
| 5,481,136 A | 1/1996 | Kohmoto et al. |

(Continued)

FOREIGN PATENT DOCUMENTS

| | | |
|---|---|---|
| CN | 105419345 | 3/2016 |
| EP | 2388810 | 11/2011 |

(Continued)

OTHER PUBLICATIONS

Sabine Szunerits, et al.; "Diamond Nanowires: A Novel Platform for Electrochemistry and Matrix-Free Mass Spectrometry"; Sensors; ISSN 1424-8220; www.mdpi.com/journal/sensors; Apr. 19, 2015; Published: May 27, 2015; pp. 12573-12593.

(Continued)

*Primary Examiner* — Kimberly N Rizkallah
*Assistant Examiner* — Dilinh P Nguyen
(74) *Attorney, Agent, or Firm* — Michael A. Davis, Jr.; Charles A. Brill; Frank D. Cimino

(57) ABSTRACT

An integrated circuit has a substrate which includes a semiconductor material, and an interconnect region disposed on the substrate. The integrated circuit includes a thermal routing trench in the substrate. The thermal routing trench includes a cohered nanoparticle film in which adjacent nanoparticles are cohered to each other. The thermal routing trench has a thermal conductivity higher than the semiconductor material contacting the thermal routing trench. The cohered nanoparticle film is formed by an additive process.

9 Claims, 31 Drawing Sheets

US 10,861,763 B2

Page 2

(51) Int. Cl.
  H01L 23/48       (2006.01)
  H01L 23/52       (2006.01)
  H01L 23/367      (2006.01)
  H01L 27/02       (2006.01)
  H01L 21/3205     (2006.01)
  H01L 21/324      (2006.01)
  H01L 21/768      (2006.01)
  H01L 23/373      (2006.01)
  H01L 23/522      (2006.01)
  H01L 23/528      (2006.01)
  H01L 23/532      (2006.01)
  H01L 21/74       (2006.01)

(52) U.S. Cl.
  CPC .. H01L 21/32055 (2013.01); H01L 21/76895
    (2013.01); H01L 23/3735 (2013.01); **H01L
    23/481 (2013.01); H01L 23/528** (2013.01);
    H01L 23/5226 (2013.01); H01L 23/53276
    (2013.01); H01L 27/0248 (2013.01); H01L
    21/743 (2013.01); H01L 23/3677 (2013.01);
    H01L 2224/48463 (2013.01)

(58) Field of Classification Search
  CPC ............... H01L 23/481; H01L 23/528; H01L
    23/53276; H01L 21/4882; H01L
    21/76801; H01L 21/76877; H01L
    23/3733; H01L 23/522; H01L 23/5226;
    H01L 24/05; H01L 24/06; H01L 23/10;
    H01L 23/34; H01L 23/36; H01L 23/4012;
    H01L 23/49568; H01L 2023/4018; H01L
    2023/4025; H01L 2023/4034
  USPC .................................. 257/713, 758, 675, 774
  See application file for complete search history.

(56) References Cited

U.S. PATENT DOCUMENTS

| | | | |
|---|---|---|---|
| 5,683,939 A | 11/1997 | Schrantz et al. | |
| 6,046,503 A | 4/2000 | Weigand et al. | |
| 6,100,199 A | 8/2000 | Joshi et al. | |
| 6,242,807 B1 | 6/2001 | Kazami | |
| 6,265,771 B1 | 7/2001 | Ference et al. | |
| 6,288,426 B1 | 9/2001 | Gauthier, Jr. et al. | |
| 6,646,340 B2 | 11/2003 | Deeter et al. | |
| 6,771,502 B2 | 8/2004 | Getz, Jr. et al. | |
| 6,773,952 B2 | 8/2004 | Armbrust et al. | |
| 6,800,886 B2 | 10/2004 | Awano | |
| 7,071,603 B2 | 7/2006 | Ha et al. | |
| 7,161,239 B2 | 1/2007 | Zhao et al. | |
| 7,189,778 B2 | 3/2007 | Tobita | |
| 7,260,939 B2 | 8/2007 | Weaver, Jr. | |
| 7,264,869 B2 | 9/2007 | Tobita | |
| 7,286,359 B2 | 10/2007 | Khbeis et al. | |
| 7,312,531 B2 | 12/2007 | Chang et al. | |
| 7,345,364 B2 | 3/2008 | Kerr et al. | |
| 7,473,633 B2 | 1/2009 | Furukawa et al. | |
| 7,560,310 B2 | 7/2009 | Hsu | |
| 7,572,680 B2 | 8/2009 | Hess et al. | |
| 7,582,962 B1 | 9/2009 | Pavio | |
| 7,586,191 B2 | 9/2009 | Hall et al. | |
| 7,633,152 B2 | 12/2009 | Lee et al. | |
| 7,642,641 B2 | 1/2010 | Mahler et al. | |
| 7,763,973 B1 | 7/2010 | Bratkovski | |
| 7,773,973 B2 | 7/2010 | Bratkovski et al. | |
| 7,768,121 B2 | 8/2010 | Colgan et al. | |
| 7,772,692 B2 | 8/2010 | Takamatsu et al. | |
| 7,825,498 B2 | 11/2010 | Haga et al. | |
| 7,859,087 B2 | 12/2010 | Murata et al. | |
| 7,989,349 B2 | 8/2011 | Sandhu et al. | |
| 8,022,532 B2 | 9/2011 | Kasuya et al. | |
| 8,106,497 B2 | 1/2012 | Brunnbauer | |
| 8,130,500 B2 | 3/2012 | Oda | |
| 8,134,231 B2 | 3/2012 | Sano et al. | |
| 8,148,820 B2 | 4/2012 | Sato | |
| 8,248,803 B2 | 8/2012 | Lin et al. | |
| 8,277,613 B2 | 10/2012 | Smith | |
| 8,410,474 B2 | 4/2013 | Okai et al. | |
| 8,440,999 B2 | 5/2013 | Dimitrakopoulos et al. | |
| 8,462,511 B2 | 6/2013 | Lee | |
| 8,466,054 B2 | 6/2013 | Stuber et al. | |
| 8,470,701 B2 | 6/2013 | Rogers et al. | |
| 8,486,824 B2 | 7/2013 | Tee et al. | |
| 8,524,539 B2 | 9/2013 | Lee et al. | |
| 8,535,758 B2 | 9/2013 | Bulovic | |
| 8,552,554 B2 | 10/2013 | Tain et al. | |
| 8,558,372 B2 | 10/2013 | Negoro | |
| 8,587,064 B2 | 11/2013 | Warabino | |
| 8,637,388 B2 | 1/2014 | Abou-khalil et al. | |
| 8,664,759 B2 | 3/2014 | Ryan | |
| 8,836,110 B2 | 9/2014 | Chopin et al. | |
| 8,865,577 B2 | 10/2014 | Wei | |
| 8,866,276 B2 | 10/2014 | Su et al. | |
| 8,866,294 B2 | 10/2014 | Pagaila et al. | |
| 8,901,613 B2 | 12/2014 | Sekar | |
| 8,937,376 B2 | 1/2015 | Tsai | |
| 8,940,628 B2 | 1/2015 | Yamazaki et al. | |
| 9,013,035 B2 | 4/2015 | Zhao et al. | |
| 9,093,428 B2 | 7/2015 | Liang | |
| 9,099,375 B2 | 8/2015 | Kub et al. | |
| 9,165,721 B2 | 10/2015 | Lee et al. | |
| 9,171,779 B2 | 10/2015 | Lin et al. | |
| 9,245,813 B2 | 1/2016 | Bartley et al. | |
| 9,308,731 B2 | 4/2016 | Williams | |
| 9,331,283 B2 | 5/2016 | Lim et al. | |
| 9,349,838 B2 | 5/2016 | Cheng et al. | |
| 9,349,975 B2 | 5/2016 | Coe-sullivan et al. | |
| 9,362,198 B2 | 6/2016 | Viswanathan | |
| 9,397,023 B2 | 7/2016 | Venugopal et al. | |
| 9,401,315 B1 | 7/2016 | Bodenweber | |
| 2001/0035578 A1 | 11/2001 | Liang et al. | |
| 2003/0064017 A1 | 4/2003 | Tobita et al. | |
| 2003/0122215 A1 | 7/2003 | Wilson | |
| 2004/0102597 A1 | 5/2004 | Tobita et al. | |
| 2005/0079120 A1 | 4/2005 | Fujita et al. | |
| 2005/0133863 A1 | 6/2005 | Werner et al. | |
| 2006/0121710 A1 | 6/2006 | Liang et al. | |
| 2006/0289988 A1 | 12/2006 | Rayn | |
| 2007/0001292 A1 | 1/2007 | Ohta et al. | |
| 2007/0126116 A1 | 6/2007 | Dangelo et al. | |
| 2008/0047484 A1 | 2/2008 | Sung | |
| 2008/0266787 A1 | 10/2008 | Gosset et al. | |
| 2009/0162954 A1 | 6/2009 | Griffin et al. | |
| 2009/0218682 A1 | 9/2009 | Lundberg | |
| 2009/0273068 A1 | 11/2009 | Kaskoun et al. | |
| 2010/0140790 A1 | 6/2010 | Setiadi et al. | |
| 2010/0148357 A1 | 6/2010 | Yang et al. | |
| 2010/0207277 A1* | 8/2010 | Bauer | H01L 24/24 257/777 |
| 2011/0039357 A1 | 2/2011 | Lin et al. | |
| 2011/0140232 A1 | 6/2011 | Gaul et al. | |
| 2011/0260303 A1 | 10/2011 | Pagaila et al. | |
| 2011/0272824 A1 | 11/2011 | Pagaila | |
| 2012/0025269 A1 | 2/2012 | Parkhurst et al. | |
| 2012/0042922 A1 | 2/2012 | Kondo et al. | |
| 2012/0086132 A1 | 4/2012 | Kim et al. | |
| 2012/0141678 A1 | 6/2012 | Sumerel | |
| 2013/0127037 A1 | 5/2013 | Mori et al. | |
| 2013/0160701 A1 | 6/2013 | Arnold et al. | |
| 2014/0008756 A1 | 1/2014 | Pei et al. | |
| 2014/0014975 A1 | 1/2014 | Bae et al. | |
| 2014/0015158 A1* | 1/2014 | Cola | B01J 23/745 264/81 |
| 2014/0057393 A1* | 2/2014 | Bonart | H01L 25/50 438/113 |
| 2014/0106508 A1 | 4/2014 | Sutardja et al. | |
| 2014/0131860 A1 | 5/2014 | Kanda et al. | |
| 2014/0321026 A1 | 10/2014 | Hermann et al. | |
| 2014/0321093 A1* | 10/2014 | Pande | H01G 11/22 361/807 |
| 2015/0008525 A1 | 1/2015 | Fukuzaki et al. | |
| 2015/0084103 A1 | 3/2015 | Okazaki et al. | |

(56) References Cited

U.S. PATENT DOCUMENTS

| | | |
|---|---|---|
| 2015/0129190 A1 | 5/2015 | Lin |
| 2015/0136357 A1 | 5/2015 | Johnson |
| 2015/0137307 A1 | 5/2015 | Stuber |
| 2015/0152239 A1 | 6/2015 | Guilera Grandes et al. |
| 2015/0159969 A1 | 6/2015 | Lu |
| 2015/0162346 A1 | 6/2015 | Choi et al. |
| 2015/0166921 A1* | 6/2015 | Erdemir ............... C10M 125/04 508/116 |
| 2015/0187678 A1 | 7/2015 | Park et al. |
| 2015/0218694 A1 | 8/2015 | Xu et al. |
| 2015/0228628 A1 | 8/2015 | Pagaila |
| 2015/0237762 A1 | 8/2015 | Holt et al. |
| 2015/0255451 A1 | 9/2015 | Yasusaka |
| 2015/0270356 A1 | 9/2015 | Palacios et al. |
| 2015/0315442 A1 | 11/2015 | Hofius |
| 2015/0325524 A1 | 11/2015 | Wada et al. |
| 2015/0325531 A1* | 11/2015 | Dyer ..................... H01L 23/481 257/620 |
| 2015/0348865 A1 | 12/2015 | Vincent et al. |
| 2016/0027717 A1 | 1/2016 | Jang et al. |
| 2016/0152794 A1* | 6/2016 | Diaham ................. C08K 3/38 428/220 |
| 2016/0197027 A1 | 7/2016 | Nasser-faili |
| 2016/0215172 A1 | 7/2016 | Morita et al. |
| 2016/0291256 A1 | 10/2016 | Rollinger |
| 2016/0379960 A1 | 12/2016 | Huang et al. |
| 2016/0380090 A1 | 12/2016 | Roberts et al. |
| 2017/0338214 A1 | 11/2017 | Uzoh et al. |

FOREIGN PATENT DOCUMENTS

| | | |
|---|---|---|
| JP | 2002088257 | 3/2002 |
| JP | 2002097371 | 4/2002 |
| JP | 3159040 | 5/2010 |
| JP | 2010205955 | 9/2010 |
| JP | 2016000506 | 1/2016 |
| KR | 20130088223 | 8/2013 |
| KR | 20140132961 | 11/2014 |
| KR | 20140142382 | 12/2014 |

OTHER PUBLICATIONS

Awano et al., Carbon Nanotubes for VLSI: Interconnect and Transistor Applications—2010, Proceedings of the IEEE, vol. 98, No. 12, pp. 2015-2031.

Sato et al., "Growth of diameter-controlled carbon nanotubes using monodisperse nicket nanoparticles obtained with a differential mobility analyzer"—2003, Chemical Phys. Lett. 382 (2003) 361-366.

International Search Report for PCT/US2017/063136 dated Apr. 5, 2018.

International Search Report for PCT/US2017/063131 dated Apr. 19, 2018.

Extended European Search Report for 17874089.0 dated Nov. 25, 2019.

Extended European Search Report for 17874052.8 dated Nov. 25, 2019.

* cited by examiner

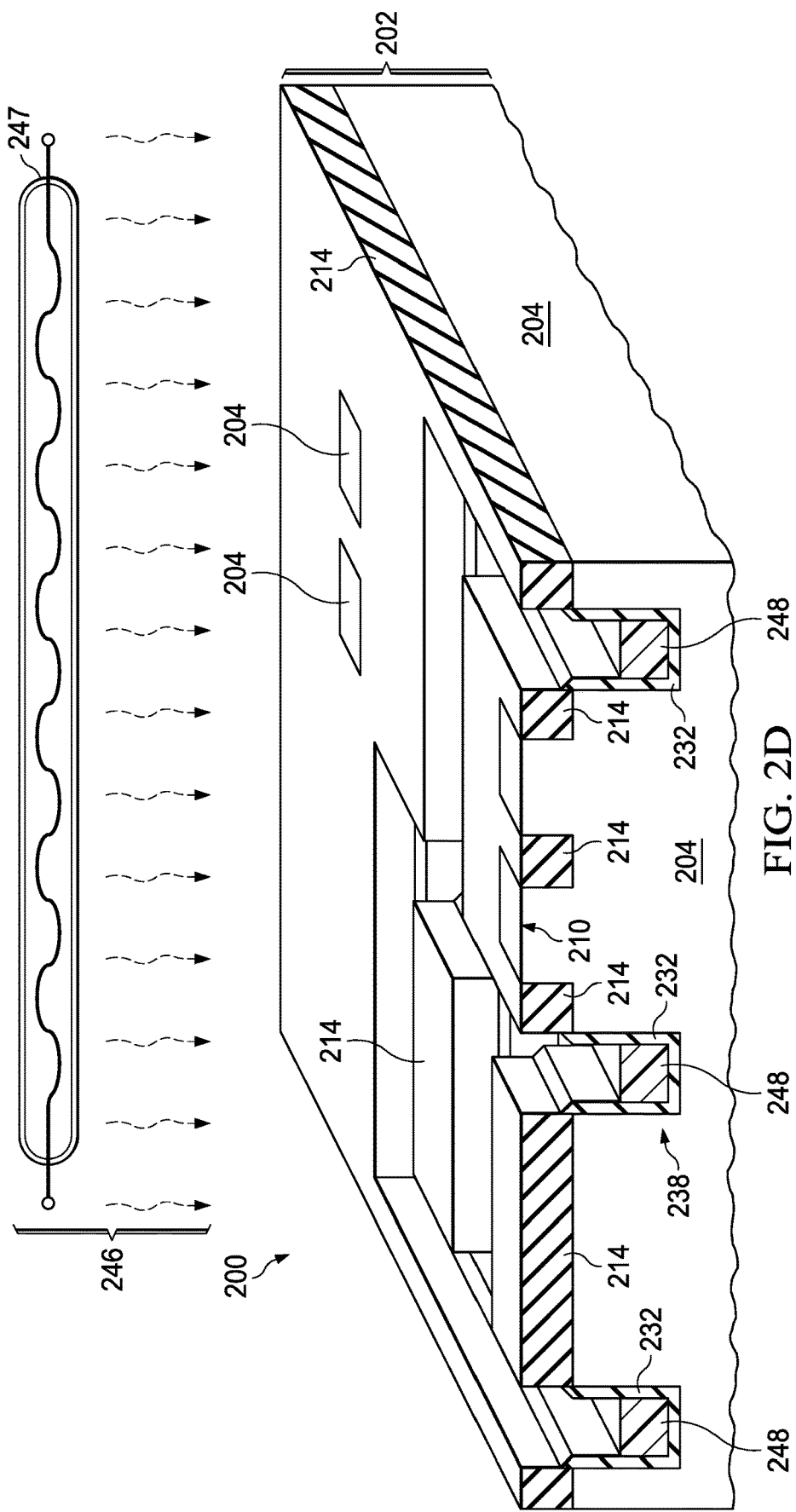

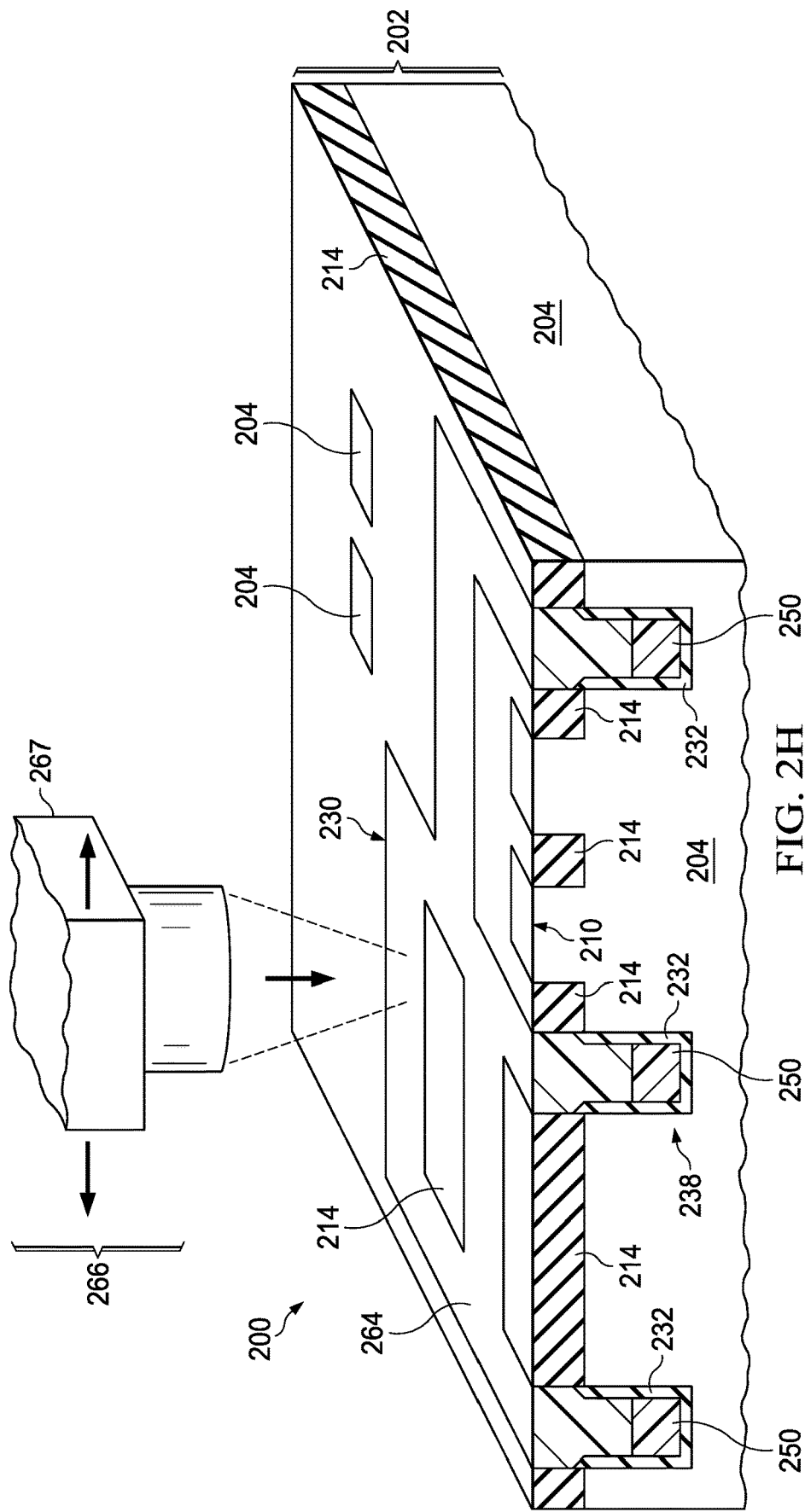

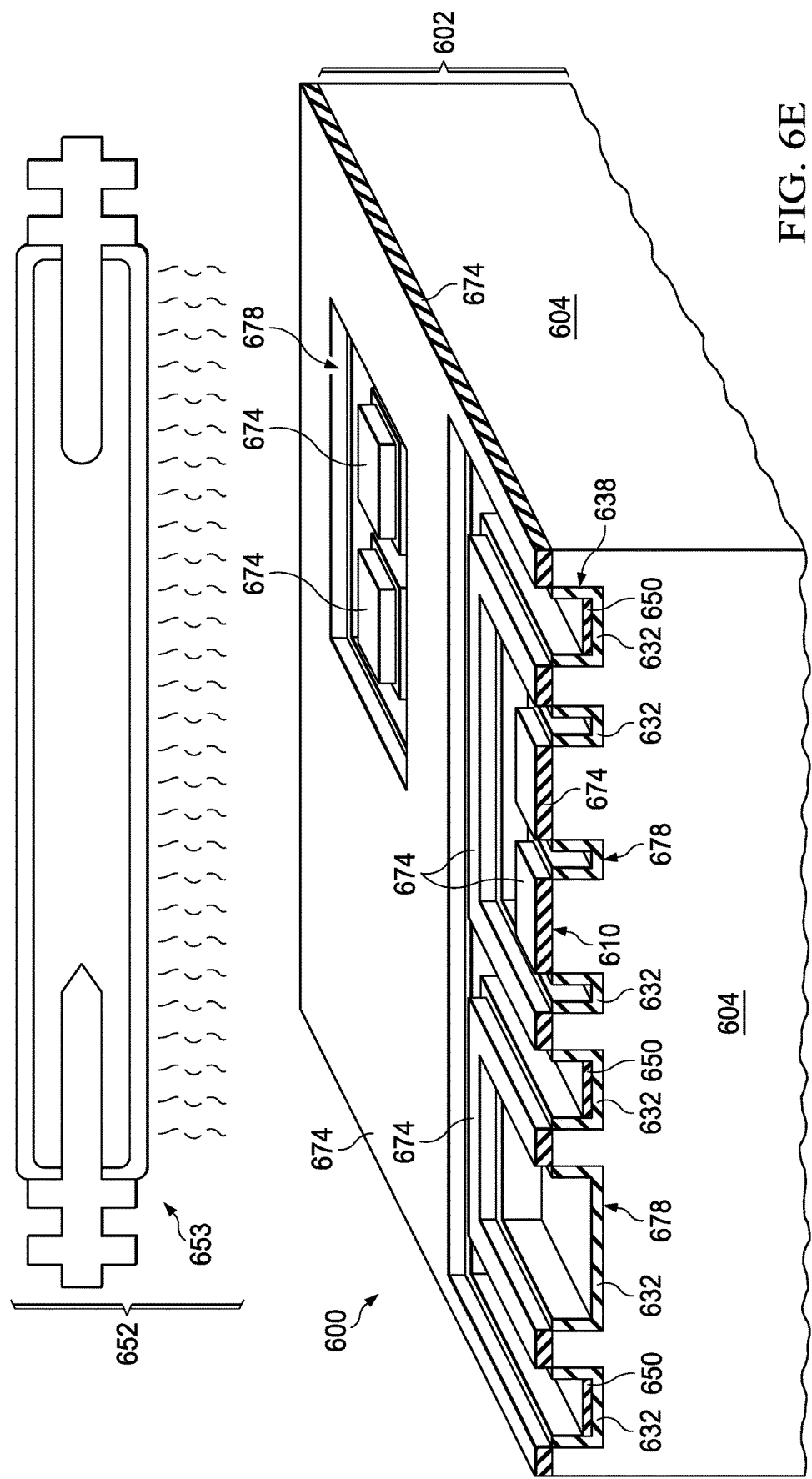

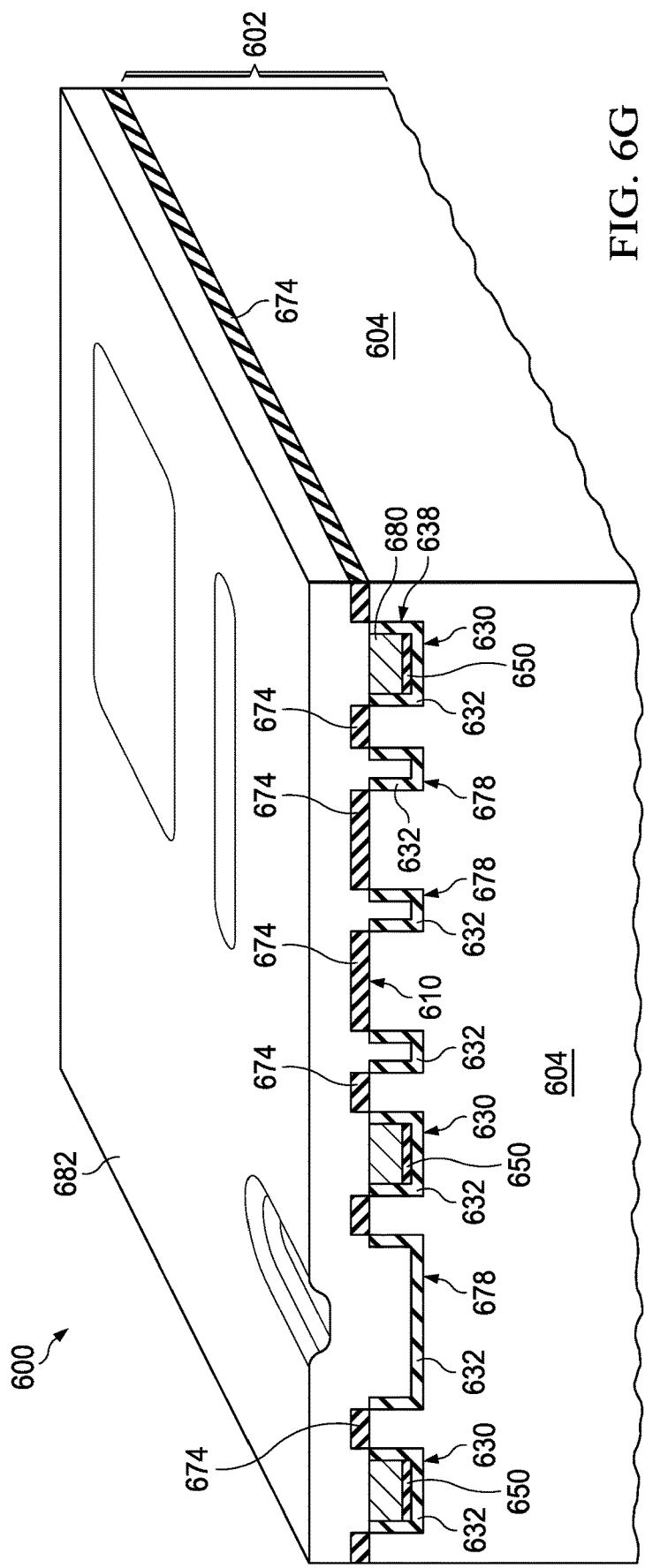

US 10,861,763 B2

1

THERMAL ROUTING TRENCH BY ADDITIVE PROCESSING

FIELD OF THE INVENTION

This disclosure relates to the field of integrated circuits. More particularly, this disclosure relates to thermal management in integrated circuits.

BACKGROUND OF THE INVENTION

Integrated circuits frequently generate undesired heat in some active components. It is sometimes desired to remove the heat through a heat sink or other passive structure. It is sometimes desired to divert the heat from thermally sensitive components in the integrated circuit. Managing excess heat in integrated circuits has become increasingly problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit has a substrate which includes a semiconductor material, and an interconnect region disposed above the substrate. The integrated circuit includes a thermal routing trench in the substrate. The thermal routing trench includes a cohered nanoparticle film in which adjacent nanoparticles are attached to each other. The thermal routing trench has a thermal conductivity higher than the semiconductor material touching the thermal routing trench. The cohered nanoparticle film is formed by a method which includes an additive process.

DESCRIPTION OF THE VIEWS OF THE DRAWINGS

FIG. 2A through FIG. 2H depict an example method of forming an integrated circuit with a thermal routing trench according to an embodiment of the invention.

FIG. 6A through FIG. 6I depict an example method of forming an integrated circuit with a thermal routing trench of the type described in reference to FIG. 5A and FIG. 5B according to an embodiment of the invention.

2

Figure 8:
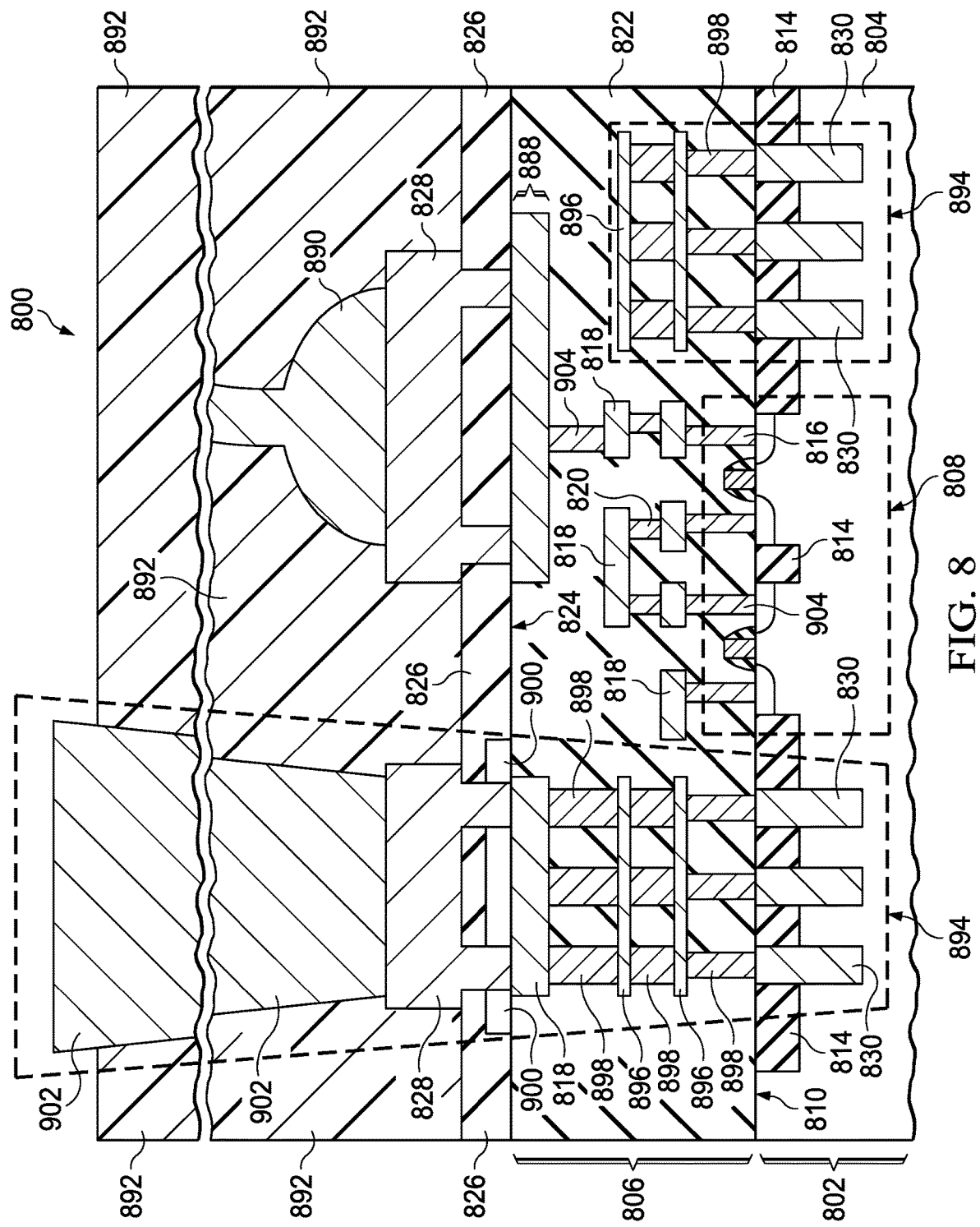

FIG. 8 is a cross section of an example integrated circuit which includes a combined thermal routing trench according to an embodiment of the invention.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following co-pending patent applications are related and hereby incorporated by reference: U.S. patent application Ser. No. 15/361,390, U.S. patent application Ser. No. 15/361,394, U.S. patent application Ser. No. 15/361,399, U.S. patent application Ser. No. 15/361,401, U.S. patent application Ser. No. 15/361,403, all filed simultaneously with this application. With their mention in this section, these patent applications are not admitted to be prior art with respect to the present invention.

Terms such as "top," "bottom," "front," "back," "over," "above," "under," "below," and such, may be used in this disclosure. These terms should not be construed as limiting the position or orientation of a structure or element, but should be used to provide spatial relationship between structures or elements.

For the purposes of this disclosure, the term "instant top surface" of an integrated circuit is understood to refer to the top surface of the integrated circuit which exists at the particular step being disclosed. The instant top surface may change from step to step in the formation of the integrated circuit.

For the purposes of this disclosure, the term "lateral" is understood to refer to a direction parallel to a plane of an instant top surface of the integrated circuit, and the term "vertical" is understood to refer to a direction perpendicular to the plane of the instant top surface of the integrated circuit.

Figures 1A, 1B:
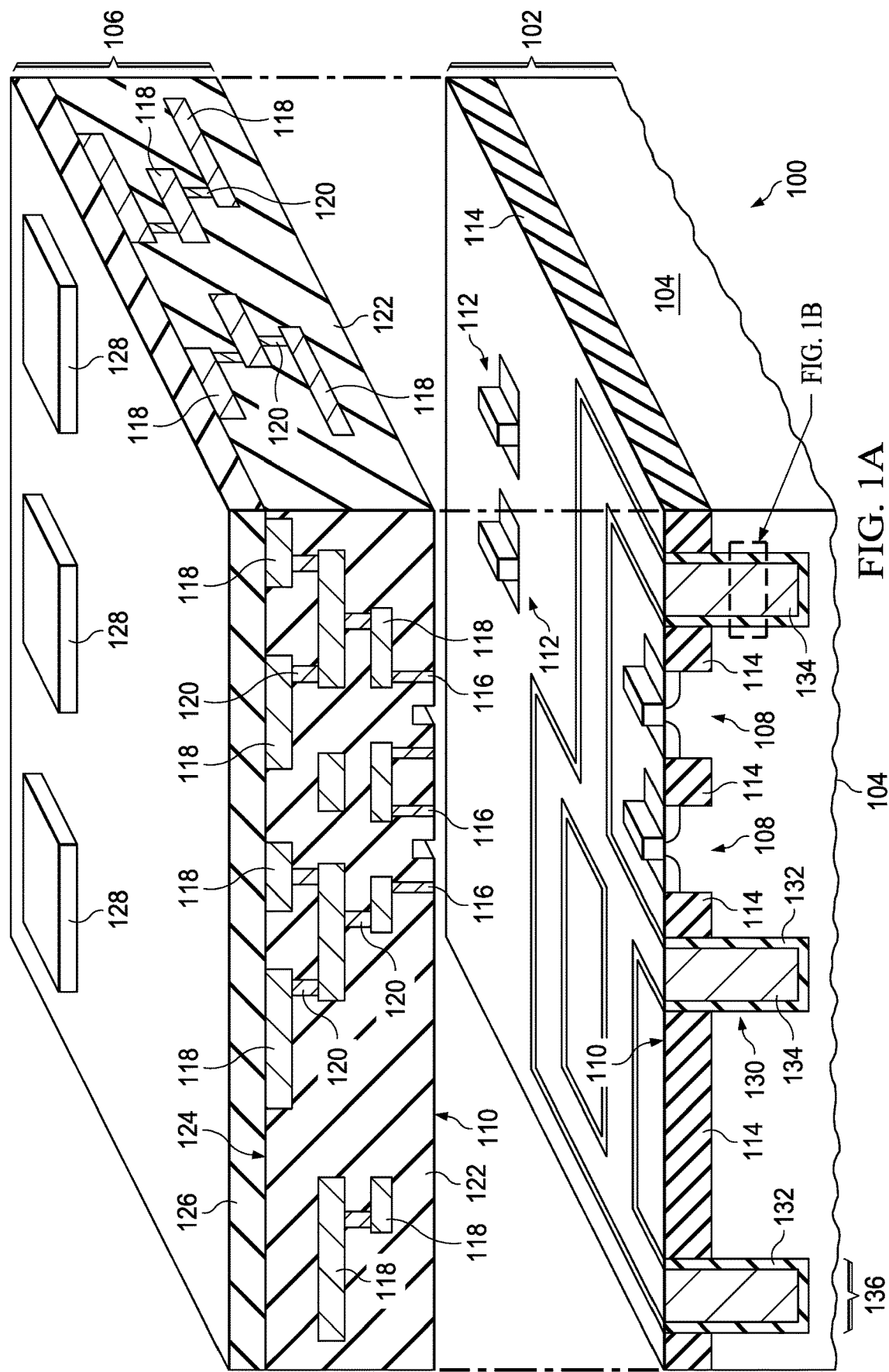
FIG. 1A and FIG. 1B are cross sections of an example integrated circuit containing a thermal routing trench according to an embodiment of the invention.
Figure 1B:
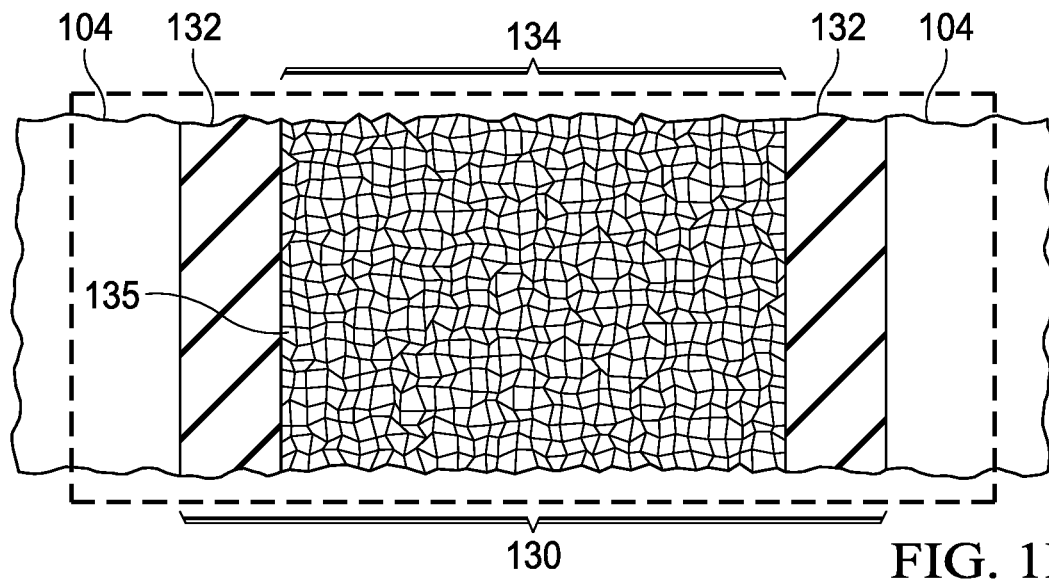

FIG. 1A and FIG. 1B are cross sections of an example integrated circuit containing a thermal routing trench according to an embodiment of the invention. Referring to FIG. 1A, the integrated circuit 100 includes a substrate 102 including a semiconductor material 104. The semiconductor material 104 may be a type IV semiconductor such as silicon, silicon germanium or silicon carbide. Other semiconductor materials are within the scope of the instant example. The integrated circuit 100 further includes an interconnect region 106 disposed above the substrate 102. Heat-generating components 108 of the integrated circuit 100, depicted in FIG. 1A as metal oxide semiconductor (MOS) transistors, are disposed in the substrate 102, possibly extending into the interconnect region 106, proximate to a boundary 110 between the substrate 102 and the interconnect region 106. Other manifestations of the heat-generating components 108, such as bipolar junction transistors, junction field effect transistors (JFETs), resistors, and silicon controlled rectifiers (SCRs) are within the scope of the instant example. In the instant example, the integrated circuit 100 may also include thermally sensitive components 112, depicted in FIG. 1A as MOS transistors. Other manifestations of the thermally sensitive components 112 are within the scope of the instant example. The components may be laterally separated by field oxide 114 at the boundary 110 between the substrate 102 and the interconnect region 106. The field oxide 114 may have, for example, a shallow trench isolation (STI) structure as depicted in FIG. 1A, or may have a localized oxidation of silicon (LOCOS) structure.

The interconnect region 106 may include contacts 116, interconnects 118 and vias 120 disposed in a dielectric layer stack 122. The contacts 116 make electrical connections to the heat-generating components 108 and the thermally sensitive components 112. The interconnects 118 are disposed in a plurality of interconnect levels. The interconnects 118 in a first interconnect level make electrical connections to the contacts 116. The vias 120 are disposed between successive interconnect levels and make electrical connections to the interconnects. A top surface 124 of the interconnect region 106 is located at a surface of the interconnect region 106 opposite to the boundary 110 between the substrate 102 and the interconnect region 106. The interconnects 118 may include aluminum interconnects, damascene copper interconnects, and/or plated copper interconnects. An aluminum interconnect may include an aluminum layer with a few percent silicon, titanium, and/or copper, possibly on an adhesion layer including titanium, and possibly with an anti-reflection layer of titanium nitride on the aluminum layer. A damascene copper interconnect may include copper on a barrier layer of tantalum and/or tantalum nitride, disposed in a trench in the dielectric layer stack 122. A plated copper interconnect may include an adhesion layer at a bottom of the interconnect, and may have a barrier layer disposed on the sides of the interconnect. A protective overcoat 126 may be disposed over the top surface 124 of the interconnect region 106. The protective overcoat 126 may include one or more layers of dielectric material, such as silicon dioxide, silicon nitride, silicon oxide nitride, and/or polyimide. Bond pad structures 128 may be disposed in and/or on the protective overcoat 126, and may be electrically coupled to the interconnects 118.

A thermal routing trench 130 is disposed in the substrate 102. In the instant example, the thermal routing trench 130 may extend upward at least to the boundary 110 between the substrate 102 and the interconnect region 106. The thermal routing trench 130 of the instant example occupies a portion, but not all, of the boundary 110. The thermal routing trench 130 has a higher thermal conductivity than the semiconductor material 104 in the substrate 102 touching the thermal routing trench 130. Thermal conductivity may be understood as a property of a material, and may be expressed in units of watts/meter ° C. In the instant example, the thermal routing trench 130 includes a liner 132 of silicon dioxide which contacts the semiconductor material 104 of the substrate 102. The liner 132 may extend onto the field oxide 114 up to the boundary 110, as depicted in FIG. 1A. Alternatively, the liner 132 may extend up to the field oxide 114, but not to the boundary 110. The thermal routing trench 130 includes a cohered nanoparticle film 134 which is separated from the semiconductor material 104 by the liner 132. The cohered nanoparticle film 134 includes primarily nanoparticles 135, shown in more details in FIG. 1B. Adjacent nanoparticles 135 cohere to each other. There may be inorganic functional molecules, for example silane-based molecules including silicon and oxygen, on surfaces of the nanoparticles 135. The thermal routing trench 130 is substantially free of an organic binder material such as adhesive or polymer.

The thermal routing trench 130 may extend from an area proximate to the heat-generating components 108 to a heat removal region 136 of the integrated circuit 100, as shown in FIG. 1A. The thermal routing trench 130 may be configured so as to extend away from the thermally sensitive components 112, as shown in FIG. 1A, advantageously diverting heat from the heat-generating components 108 away from the thermally sensitive components 112 during operation of the integrated circuit 100. FIG. 1A is an exploded view to more clearly show the spatial configuration of the thermal routing trench 130 with respect to the heat-generating components 108, the thermally sensitive components 112, and the heat removal region 136.

In a version of the instant example as depicted in FIG. 1A and FIG. 1B, thermal routing trench 130 may be electrically non-conductive, and the nanoparticles 135 may include, for example, aluminum oxide, diamond, hexagonal boron nitride, cubic boron nitride, and/or aluminum nitride.

In another version of the instant example, the thermal routing trench 130 may be electrically conductive. In such a version, the nanoparticles 135 may include nanoparticles of, for example, metal, graphene, graphene embedded in metal, graphite, graphitic carbon, and/or carbon nanotubes. Electrically conductive versions of the nanoparticles 135 may be electrically isolated from the semiconductor material 104 by the liner 132.

In a further version of the instant example, the nanoparticles 135 may include metal, and the thermal routing trench 130 may include a layer of graphitic material on the cohered nanoparticle film 134. In such a version, the nanoparticles 135 may include, for example, copper, nickel, palladium, platinum, iridium, rhodium, cerium, osmium, molybdenum, and/or gold. The graphitic material may include graphite, graphitic carbon, graphene, and/or carbon nanotubes or the like. In such a version, the thermal routing trench 130 is electrically conductive, and hence may be electrically isolated from the semiconductor material 104 by the liner 132.

Figure 2A:
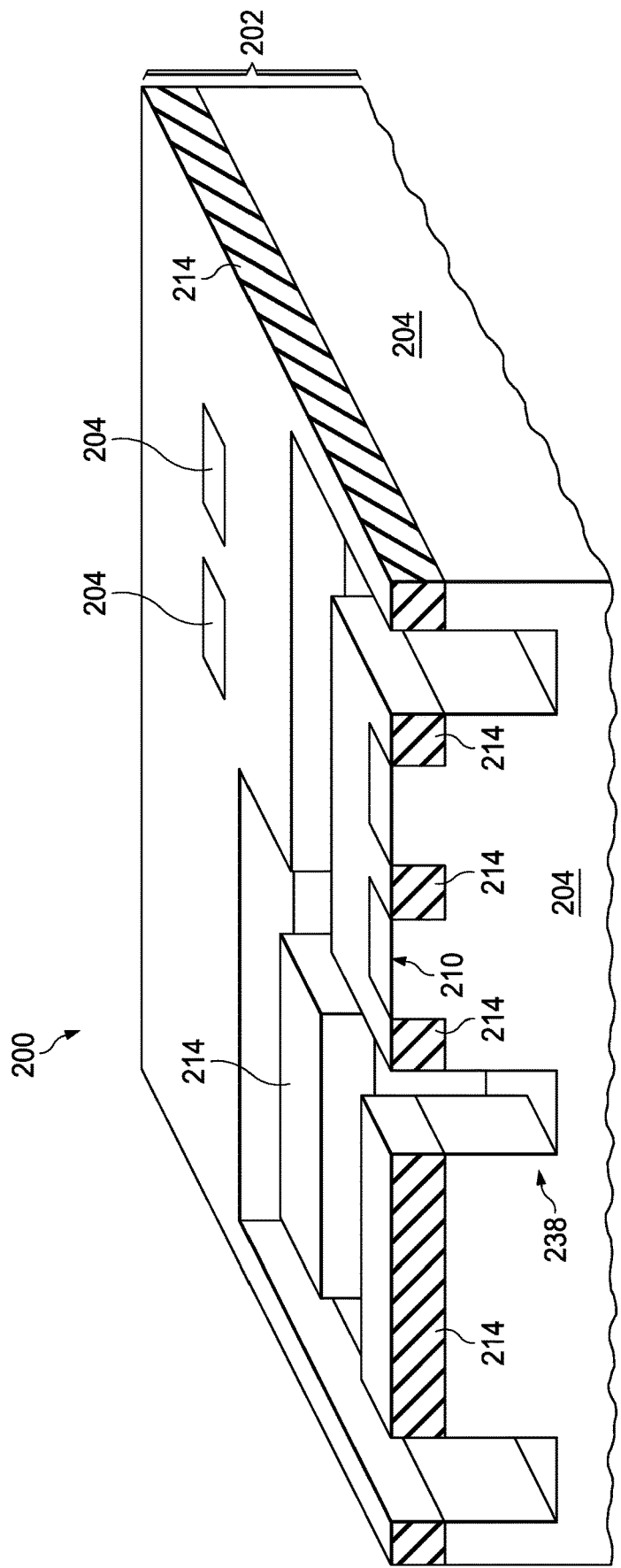

FIG. 2A through FIG. 2H depict an example method of forming an integrated circuit with a thermal routing trench having a configuration similar to that described in reference to FIG. 1A and FIG. 1B according to an embodiment of the invention. Referring to FIG. 2A, the integrated circuit 200 is formed on a substrate 202 which includes a semiconductor material 204. The substrate 202 may be, for example a semiconductor wafer. The semiconductor material 204 may be a type IV semiconductor such as silicon, silicon germanium or silicon carbide. Alternatively, the semiconductor material 204 may be a type III-V semiconductor such as gallium nitride or gallium arsenide. Other semiconductor materials are within the scope of the instant example. Field oxide 214 may be formed in the substrate 202 to laterally separate components of the integrated circuit 200. The field oxide 214 may be formed by an STI process or alternatively by a LOCOS process. In the instant example, the field oxide 214 may be formed prior to forming the thermal routing trench.

Forming the thermal routing trench of the instant example begins with forming a trench 238 in the substrate 202. The trench 238 may be formed, for example, by forming an etch mask, including photoresist and/or hard mask material such as silicon nitride, over the substrate 202, which exposes an area for the trench 238. A subsequent etch process, such as a reactive ion etch (RIE) process using halogen radicals, removes a portion of the semiconductor material 204 in the area exposed by the etch mask, forming the trench 238. The etch mask may be subsequently removed. Alternatively, the etch mask may be left in place while a liner is formed in the trench 238. The trench 238 may extend 100 nanometers to 10 microns in the substrate 202 below a top surface 210 of the substrate 202. The top surface 210 of the substrate 202 is also a boundary between the substrate 202 and a subsequently formed interconnect region above the substrate 202.

Figure 2B:
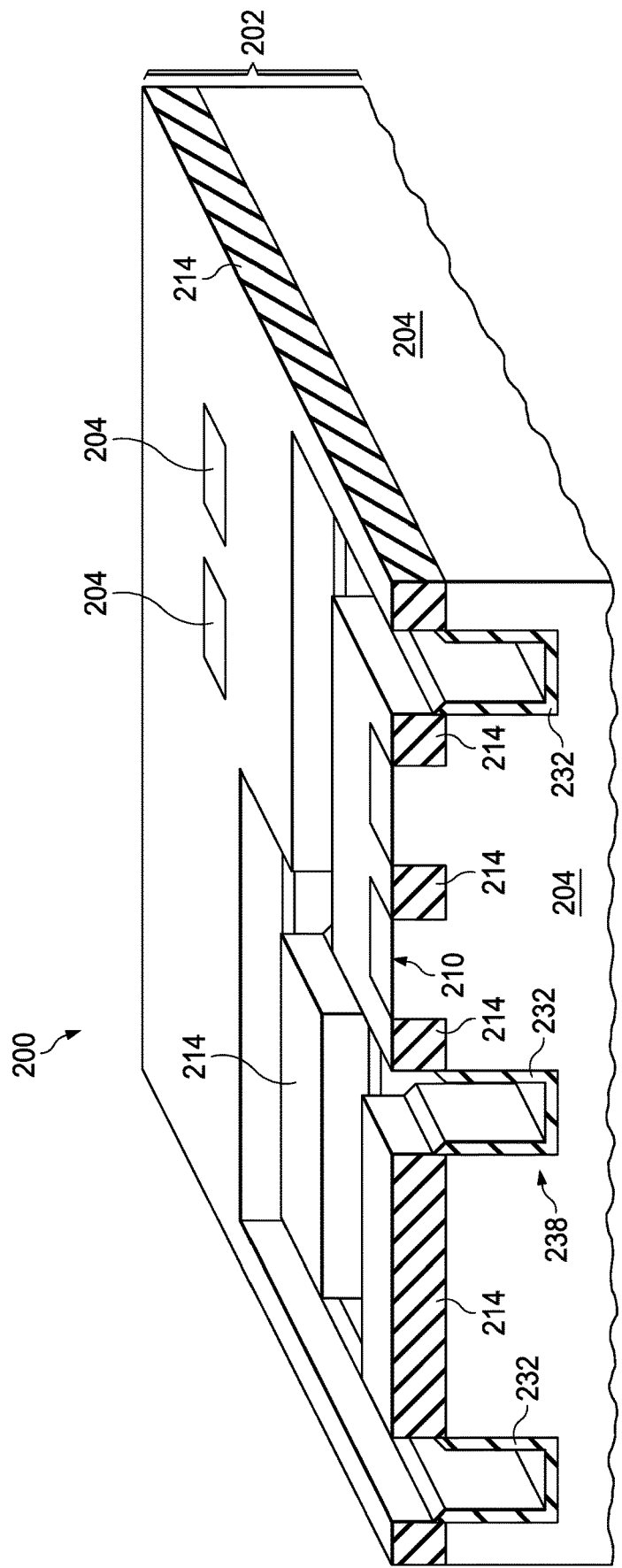

Referring to FIG. 2B, a liner 232 is formed in the trench 238. The liner 232 abuts the semiconductor material 204. In one version of the instant example, the liner 232 may be formed by thermal oxidation of silicon in the semiconductor material 204, resulting in the liner 232 extending up to the field oxide 214 as depicted in FIG. 2B. In another version, the liner 232 may be formed by forming a thin film of dielectric material in the trench 238, for example by an atmospheric pressure chemical vapor deposition (APCVD) process or a plasma enhanced chemical vapor deposition (PECVD) process. An APCVD process may be used for a version of the trench 238 having a depth to width ratio, referred to as an aspect ratio, greater than 2. A PECVD process may be used for a version of the trench 238 having an aspect ratio less than 3. The liner 232 may be, for example, 10 nanometers to 500 nanometers thick.

Figure 2C:
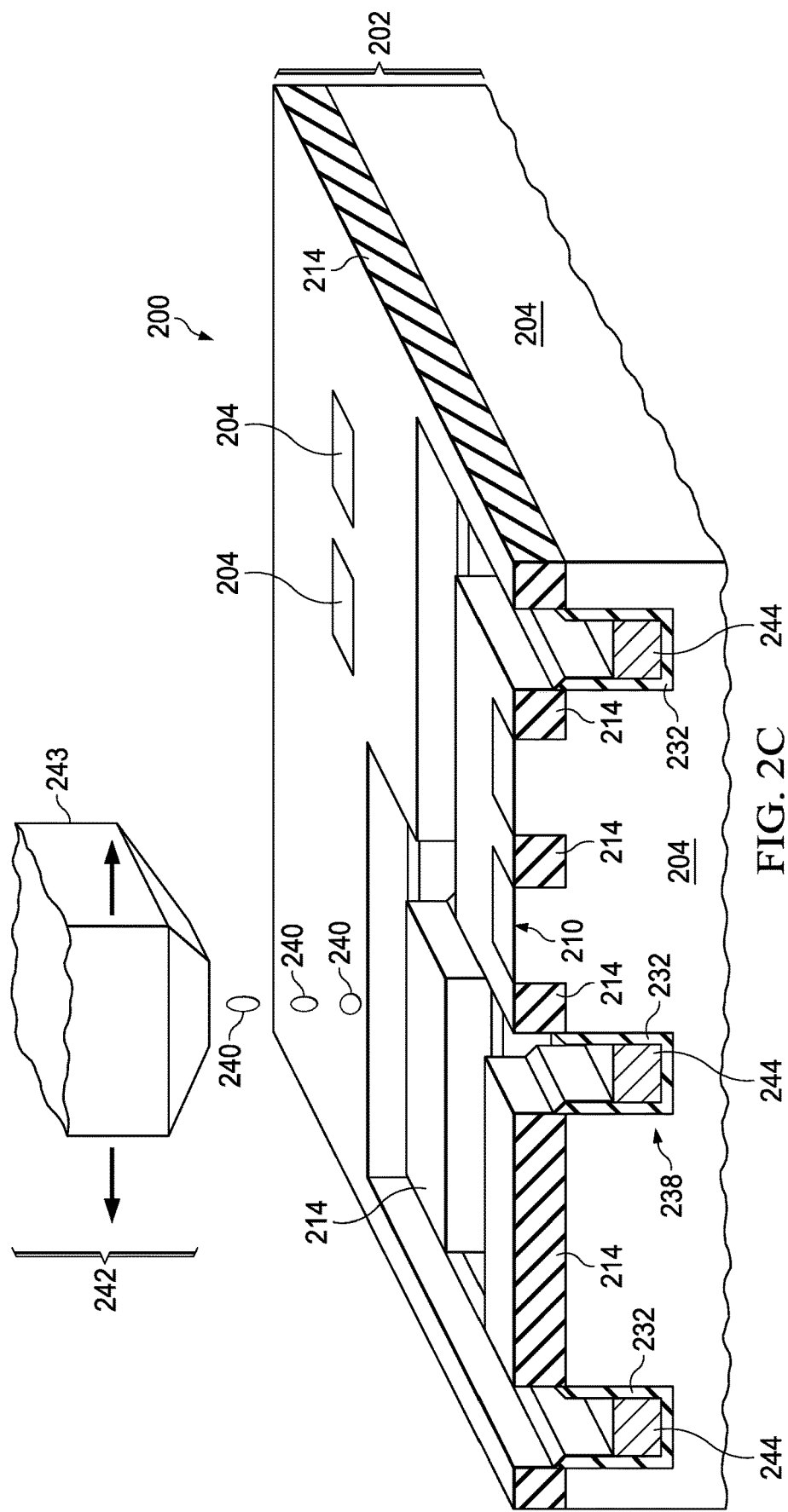

Referring to FIG. 2C, a first nanoparticle ink 240 is dispensed by a first additive process 242 into the trench 238 on the liner 232 to form a first nanoparticle ink film 244 which partially fills the trench 238. For the purposes of this disclosure, an additive process may be understood to dispose the nanoparticles in a desired area and not dispose the nanoparticles outside of the desired area, so that it is not necessary to remove a portion of the dispensed nanoparticles to produce a final desired shape of the nanoparticles. Additive processes may enable forming films in desired areas without photolithographic processes and subsequent etch processes, thus advantageously reducing fabrication cost and complexity. The first nanoparticle ink 240 includes nanoparticles and a carrier fluid. The first nanoparticle ink 240 may be, for example, an ink, a slurry, or a sol gel. The nanoparticles may include materials described for the nanoparticles 135 in reference to FIG. 1A and FIG. 1B. There may be inorganic functional molecules, for example including silicon and oxygen, on surfaces of the nanoparticles.

The first nanoparticle ink 240 is dispensed by the first additive process 242 into the trench 238, and is not dispensed onto the top surface 210 of the substrate 202. The first additive process 242 may include a discrete droplet process, sometimes referred to as an inkjet process, using a discrete droplet dispensing apparatus 243 as depicted in FIG. 2A. The discrete droplet dispensing apparatus 243 may be configured so that the integrated circuit 200 and the discrete droplet dispensing apparatus 243 may be moved laterally with respect to each other to provide a desired dispensing pattern for the first nanoparticle ink film 244. The discrete droplet dispensing apparatus 243 may have a plurality of dispensing ports which may be independently activated in parallel to provide a desired throughput for the first additive process 242. In an alternate version of the instant example, the first additive process 242 may include a continuous extrusion process, a direct laser transfer process, an electrostatic deposition process, or an electrochemical deposition process.

Referring to FIG. 2D, the first nanoparticle ink film 244 of FIG. 2C is heated by a first bake process 246 to remove at least a portion of a volatile material from the first nanoparticle ink film 244 to form a first nanoparticle film 248 which includes primarily nanoparticles. The first bake process 246 may be a radiant heat process, using, for example, an incandescent light source 247 as indicated schematically in FIG. 2D, or infrared light emitting diodes (IR LEDs). Alternatively, the first bake process 246 may be a hot plate process which heats the first nanoparticle ink film 244 through the substrate 202. The first bake process 246 may be performed in a partial vacuum, or in an ambient with a continuous flow of gas at low pressure, to enhance removal of the volatile material.

Figure 2E:
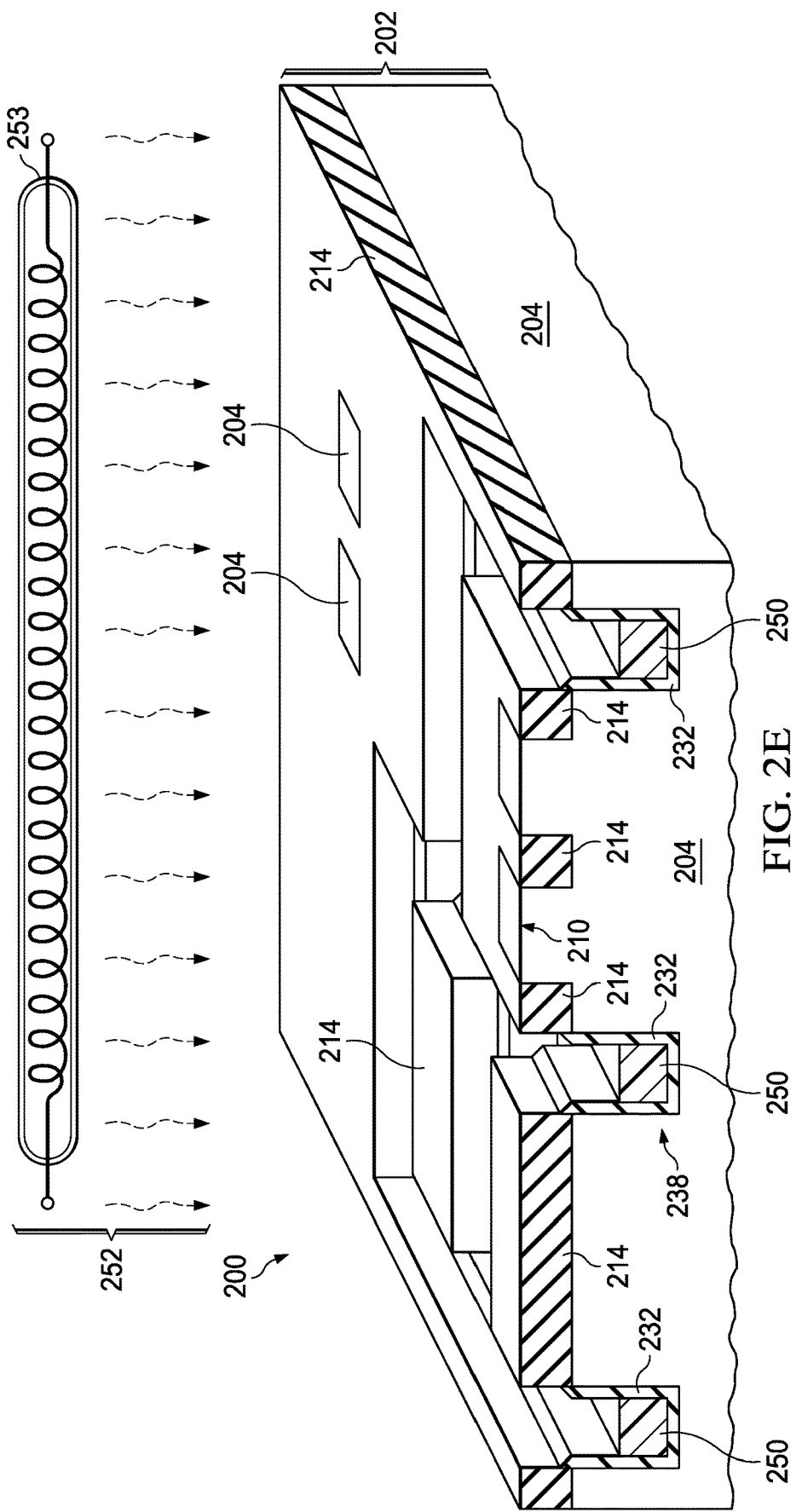

Referring to FIG. 2E, the first nanoparticle film 248 of FIG. 2D is heated by a first cohesion inducing process 252 so that adjacent nanoparticles cohere to each other, to form a first cohered nanoparticle film 250 in the trench 238. The temperature required for the nanoparticles to cohere to each other is a function of the size of the nanoparticles. Smaller nanoparticles may be heated at lower temperatures than larger nanoparticles to attain a desired cohesion of the nanoparticles. The nanoparticles may be selected to enable cohesion at a temperature compatible with the integrated circuit components and structures. Cohesion may occur by a process that includes a physical mechanism involving diffusion of atoms between the adjacent nanoparticles. Cohesion may also occur by a process that includes a chemical mechanism involving reaction of atoms between the adjacent nanoparticles. The first cohesion inducing process 252 may include a spike heating process, which provides radiant energy, commonly from an incandescent light source 253 as depicted in FIG. 2E, for a time period of 100 milliseconds to 5 seconds, across the existing top surface of the integrated circuit 200.

In one variation of the instant example, the first cohesion inducing process 252 may include a flash heating process, which applies radiant energy for 1 microsecond to 10 microseconds. In another variation, the first cohesion inducing process 252 may include a scanned laser heating process. The scanned laser heating process may provide heat to substantially only the first nanoparticle film 248, by using a raster scan process or a vector scan process. In an alternate version of the instant example, the first bake process 246 described in reference to FIG. 2D may be combined with the first cohesion inducing process 252, wherein thermal power applied to the first nanoparticle film 248 of FIG. 2D is ramped to first remove the volatile material, followed by inducing cohesion of the nanoparticles. Other methods of inducing cohesion between the nanoparticles are within the scope of the instant example. Forming the first cohered nanoparticle film 250 to partially fill the trench 238 may enable greater cohesion of the nanoparticles in the first cohered nanoparticle film 250, compared to a single cohered nanoparticle film that completely fills the trench 238, and thus improve the thermal conductivity of the completed thermal routing trench.

Figure 2F:
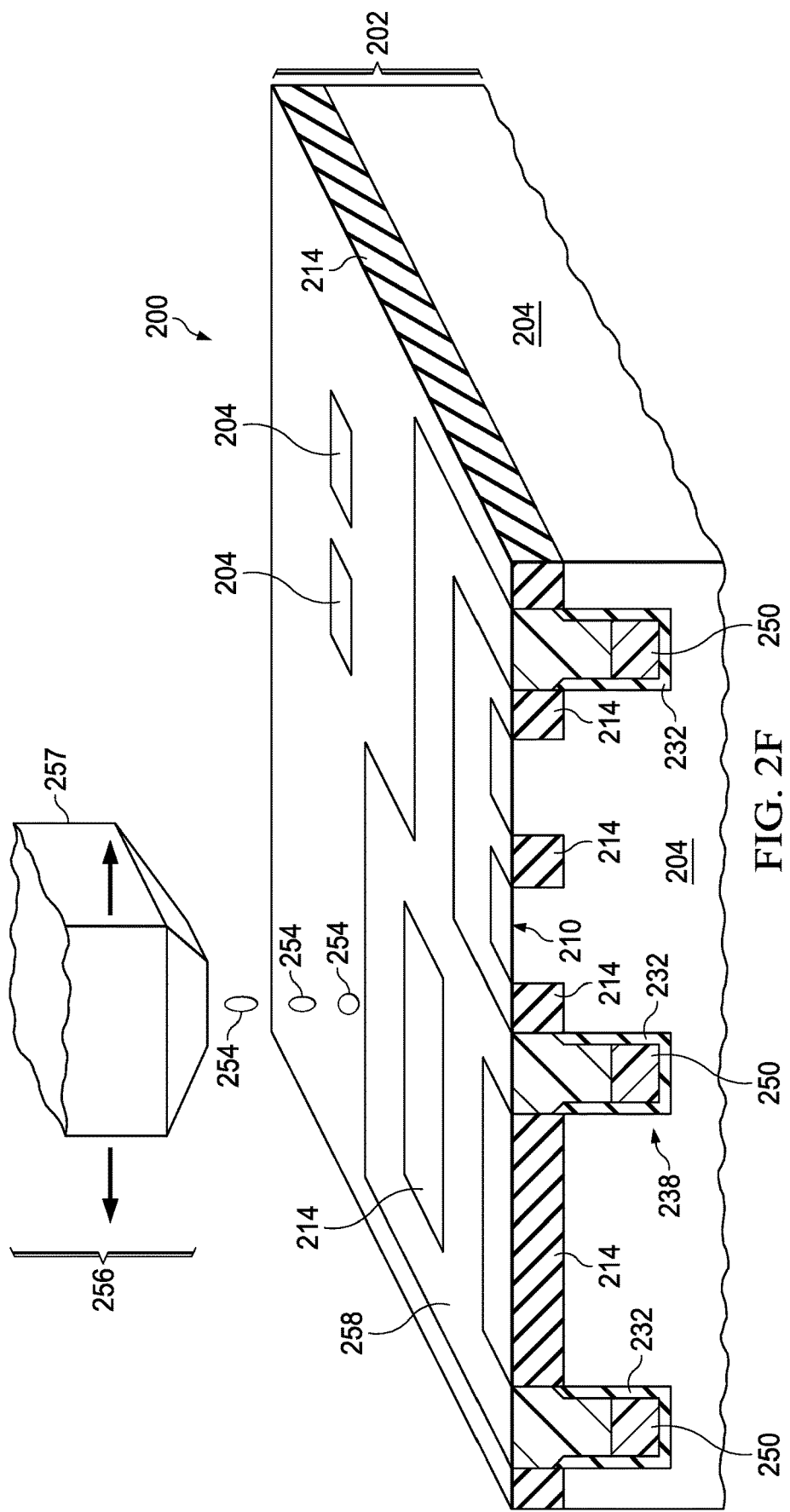

Referring to FIG. 2F, a second nanoparticle ink 254 is dispensed by a second additive process 256 into the trench 238 on the first cohered nanoparticle film 250 to form a second nanoparticle ink film 258 which fills the trench 238. The second nanoparticle ink 254 includes nanoparticles and a carrier fluid, and may have a similar composition to the first nanoparticle ink 240 of FIG. 2C. The second nanoparticle ink 254 is dispensed by the second additive process 256 into the trench 238, and is not dispensed onto the top surface 210 of the substrate 202. The second additive process 256 may use the same type of apparatus used by the first additive process 242 described in reference to FIG. 2C, for example a discrete droplet dispensing apparatus 257 as depicted in FIG. 2F. Alternatively, the second additive process 256 may use a different apparatus or may use a different process, especially if the composition of the second nanoparticle ink film 258 is different from the composition of the first nanoparticle ink film 244.

Figure 2G:
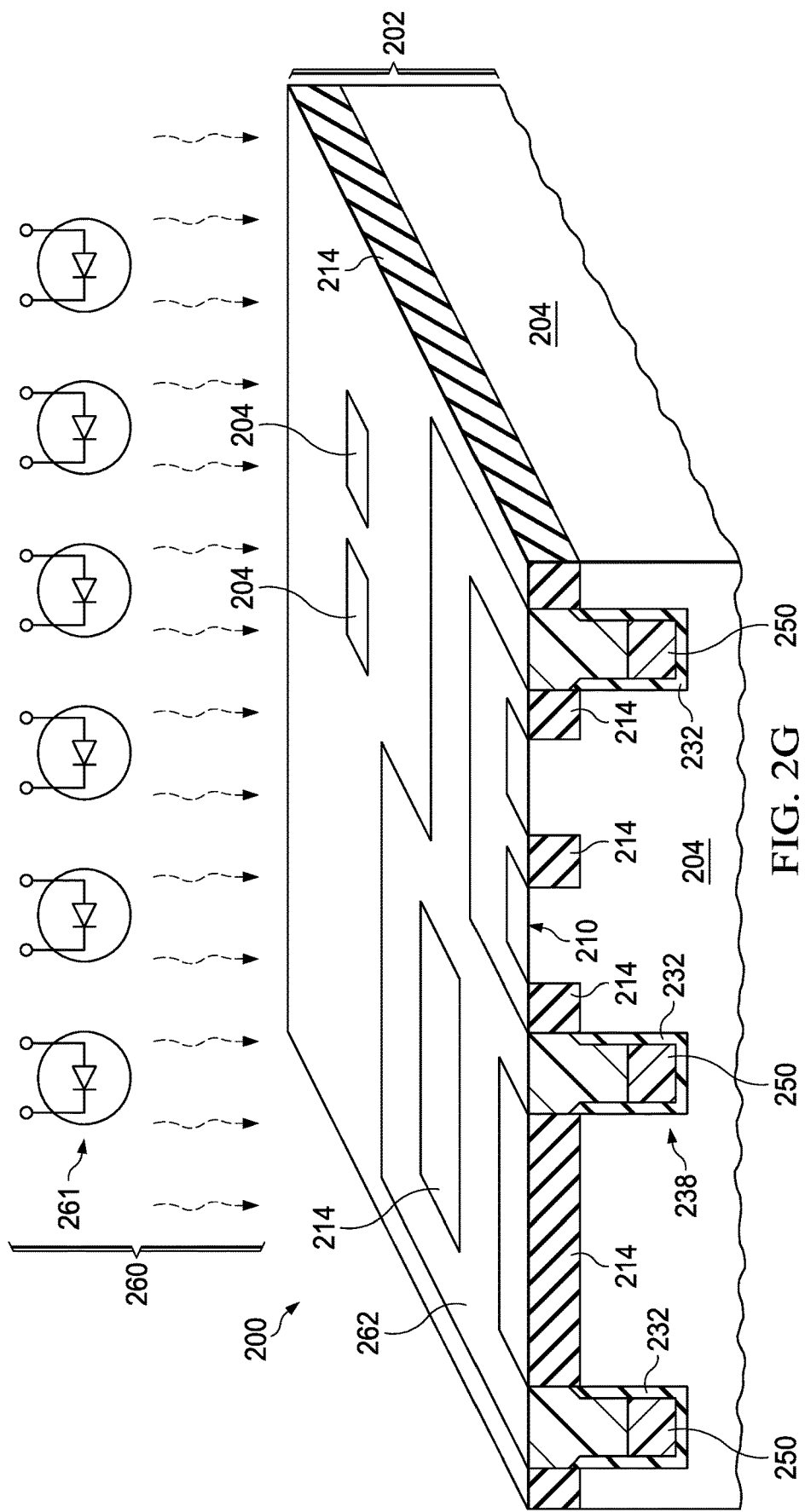

Referring to FIG. 2G, the second nanoparticle ink film 258 of FIG. 2F is heated by a second bake process 260 to remove at least a portion of a volatile material from the second nanoparticle ink film 258 to form a second nanoparticle film 262 which includes primarily nanoparticles. The second bake process 260 may use IR LEDs 261 as depicted schematically in FIG. 2G. Using the IR LEDs 261 may enable application of the radiant heat to substantially only an area containing the second nanoparticle ink film 258 while not applying the radiant heat to areas of the integrated circuit 200 outside of the trench 238. Alternatively, the second bake process 260 may be include a radiant heat process using an incandescent source, or may include a hot plate process. The second bake process 260 may optionally be performed at a higher temperature or for a longer time than the first bake process 246.

Referring to FIG. 2H, the second nanoparticle film 262 of FIG. 2G is heated by a second cohesion inducing process 266 so that adjacent nanoparticles in the second nanoparticle film 262 cohere to each other, to form a second cohered nanoparticle film 264 in the trench 238 over the first cohered nanoparticle film 250. The second cohesion inducing process 266 may include, for example, a second scanned laser heating process using a scanning laser apparatus 267 as depicted in FIG. 2H. Further cohesion of the nanoparticles in the first cohered nanoparticle film 250 may be induced by the second cohesion inducing process 266.

The first cohered nanoparticle film 250 and the second cohered nanoparticle film 264, combined with the liner 232 may provide the thermal routing structure 230. Alternatively, additional nanoparticle ink films may be formed, baked and heated to induce nanoparticle cohesion, to combine with the first cohered nanoparticle film 250 and the second cohered nanoparticle film 264.

Figure 3B:
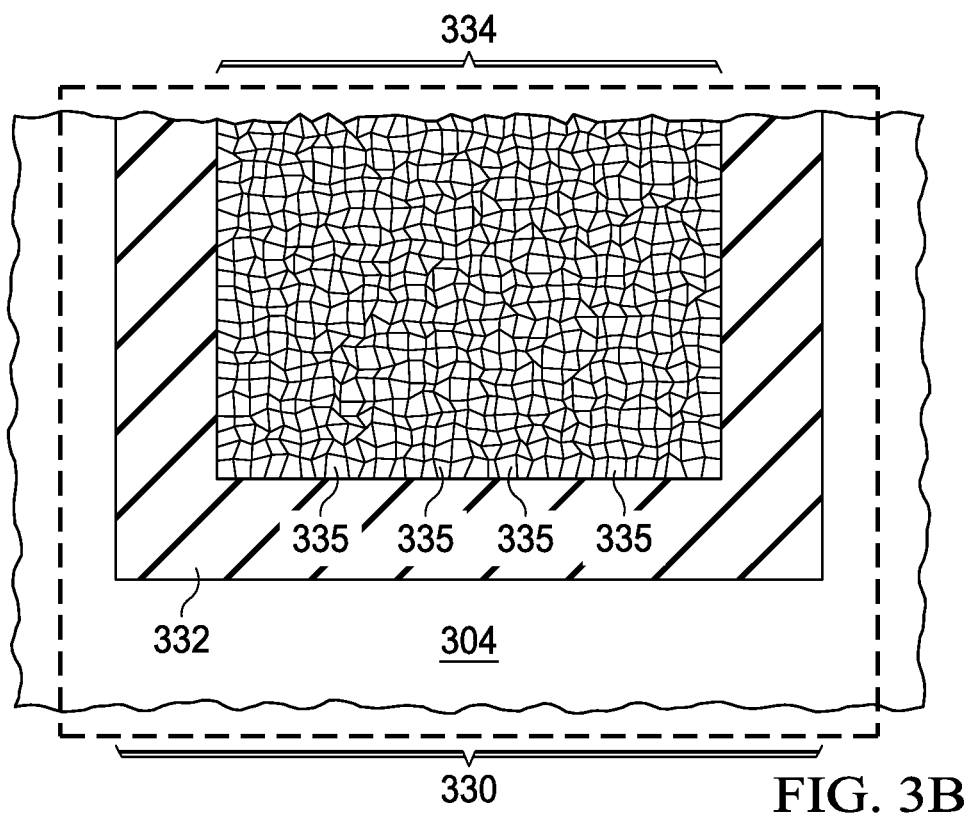
FIG. 3A and FIG. 3B are cross sections of another example integrated circuit containing a thermal routing trench according to an embodiment of the invention.
Figure 3A:
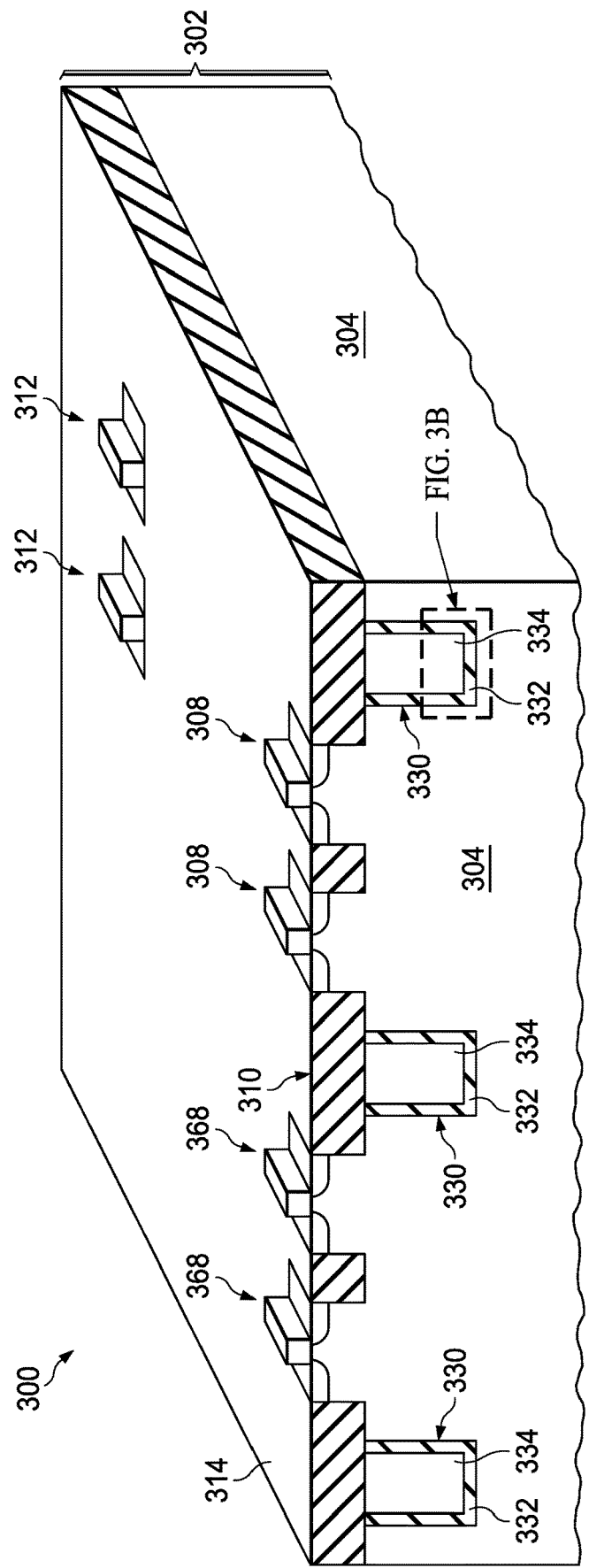

FIG. 3A and FIG. 3B are cross sections of another example integrated circuit containing a thermal routing trench according to an embodiment of the invention. Referring to FIG. 3A, the integrated circuit 300 includes a substrate 302 including a semiconductor material 304. The integrated circuit 300 further includes an interconnect region, not shown in FIG. 3A, disposed above the substrate 302. The interconnect region may be similar to the interconnect region 106 described in reference to FIG. 1A. In the instant example, a first set of components 308 and a second set of components 368 are disposed in the substrate 302, proximate to a top surface 310 of the substrate 302. The top surface 310 is also a boundary 310 between the substrate 302 and the interconnect region. In the instant example, the first set of components 308 and the second set of components 368 may be matching components whose performance benefits from having similar thermal environments. Matching components may be understood as components which are designed to have substantially equal performance parameters such as drive current and threshold. Because these performance parameters are affected by temperature, reducing a temperature difference between matching components may advantageously reduce differences in the performance parameters. The integrated circuit 300 may further include thermally sensitive components 312 whose performance improves as a temperature decreases. The components 308, 368 and 312 are depicted in FIG. 3A as MOS transistors, however other manifestations, such as bipolar junction transistors, JFETs, resistors, diodes, and SCRs are within the scope of the instant example. The components 308, 368 and 312 may be laterally separated by field oxide 314 at the top surface 310 of the substrate 302.

A thermal routing trench 330 is disposed in the substrate 302. In the instant example, the field oxide 314 overlies the thermal routing trench 330, and the thermal routing trench 330 extends upward to a lower surface of the field oxide 314. The thermal routing trench 330 of the instant example occupies a portion, but not all, of the lower surface the field oxide 314. The thermal routing trench 330 has a higher thermal conductivity than the semiconductor material 304 in the substrate 302 touching the thermal routing trench 330. In the instant example, the thermal routing trench 330 includes a liner 332 of dielectric material which contacts the semiconductor material 304 of the substrate 302. The thermal routing trench 330 includes a cohered nanoparticle film 334 which are separated from the semiconductor material 304 by the liner 332. The cohered nanoparticle film 334 includes primarily nanoparticles 335. Adjacent nanoparticles 335 are cohered to each other. There may be inorganic functional molecules, for example silane-based molecules including silicon and oxygen, on surfaces of the nanoparticles 335. The nanoparticles 335 may include the materials disclosed in reference to FIG. 1A and FIG. 1B. The thermal routing trench 330 is substantially free of an organic binder material such as adhesive or polymer. The thermal routing trench 330, including the liner 332 and the cohered nanoparticle film 334, is shown in more detail in FIG. 3B. In one version of the instant example, the nanoparticles 335 may include catalyst metal, and the thermal routing trench 330 may include graphitic material disposed on the cohered nanoparticle film 334.

The thermal routing trench 330 may extend around the first set of components 308 and the second set of components 368, as shown in FIG. 3A. The thermal routing trench 330 may be configured so as to extend away from the thermally sensitive components 312, as shown in FIG. 3A, advantageously diverting heat from the first set of components 308 and the second set of components 368 away from the thermally sensitive components 312 during operation of the integrated circuit 300. Thus, the thermal routing trench 330 may provide a more closely matched thermal environment for the first set of components 308 and the second set of components 368 and thereby improve their performance, while advantageously diverting heat from the first set of components 308 and the second set of components 368 away from the thermally sensitive components 312.

Figure 4A:
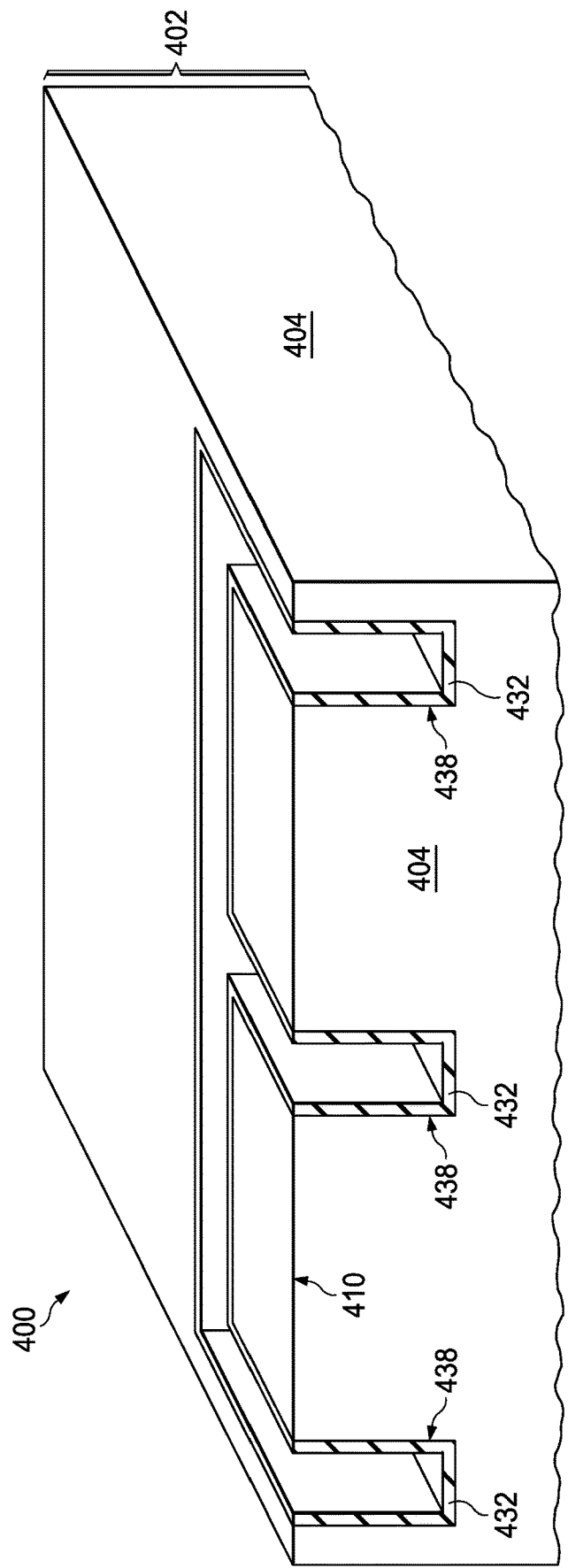
FIG. 4A through FIG. 4G depict an example method of forming an integrated circuit with a thermal routing trench of the type described in reference to FIG. 3A and FIG. 3B according to an embodiment of the invention.

FIG. 4A through FIG. 4G depict an example method of forming an integrated circuit with a thermal routing trench of the type disclosed in reference to FIG. 3A and FIG. 3B according to an embodiment of the invention. Referring to FIG. 4A, the integrated circuit 400 is formed on a substrate 402 which includes a semiconductor material 404. Forming the thermal routing trench of the instant example begins with forming a trench 438 in the substrate 402 prior to forming field oxide. The trench 438 may be formed, for example, by an RIE process. The trench 438 extends below a depth of subsequently-formed field oxide. For example, the trench 438 may extend 500 nanometers to 10 microns in the substrate 402 below a top surface 410 of the substrate 402. The top surface 410 of the substrate 402 is also a boundary between the substrate 402 and a subsequently formed interconnect region above the substrate 402.

A liner 432 is formed in the trench 438. The liner 432 abuts the semiconductor material 404. The liner 432 may be formed by thermal oxidation of silicon in the semiconductor material 404 abutting the trench 438, or may be formed by forming one or more layers of dielectric material by a chemical vapor deposition (CVD) process such as an APCVD process or a PECVD process. The liner 432 may be, for example, 10 nanometers to 500 nanometers thick.

Figure 4B:
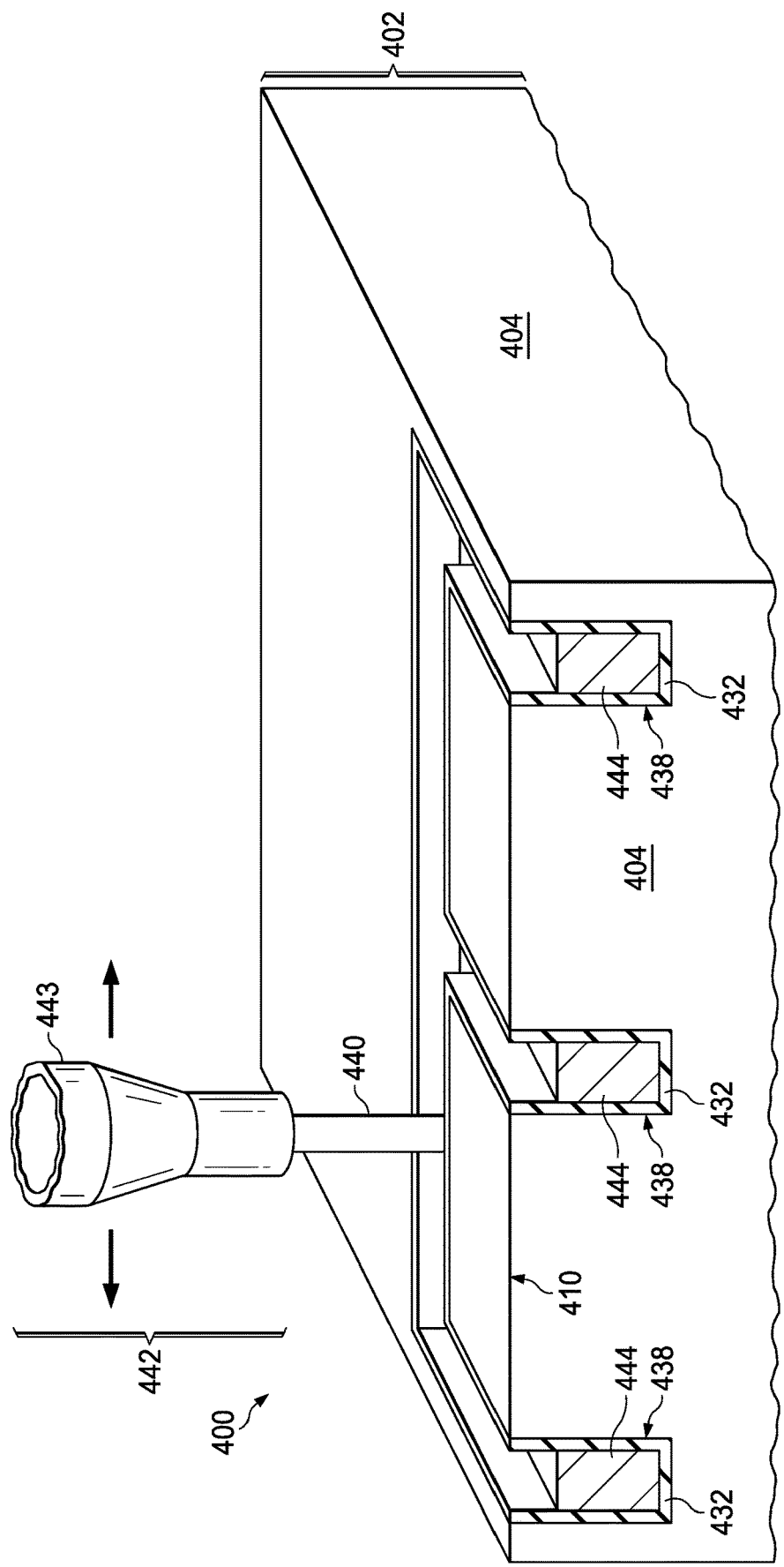

Referring to FIG. 4B, a nanoparticle ink 440 is dispensed by an additive process 442 into the trench 438 on the liner 432 to form a nanoparticle ink film 444 which partially fills the trench 438. The nanoparticle ink 440 includes nanoparticles and a carrier fluid, for example as an ink, a slurry, or a sol gel. The nanoparticles may include materials described for the nanoparticles 135 in reference to FIG. 1A and FIG. 1B. The nanoparticle ink 440 is dispensed by the additive process 442 into the trench 438, and is not dispensed onto the top surface 410 of the substrate 402. The additive process 442 may a continuous extrusion process, using a continuous dispensing apparatus 443, depicted in FIG. 4B as a needle dispensing head. The integrated circuit 400 and the continuous dispensing apparatus 443 may be configured to move laterally with respect to each other to dispense the nanoparticle ink 440 into the trench 438, and not onto the top surface 410 of the substrate 402. In an alternate version of the instant example, the additive process 442 may include a discrete droplet process, a direct laser transfer process, an electrostatic deposition process, or an electrochemical deposition process.

Figure 4C:
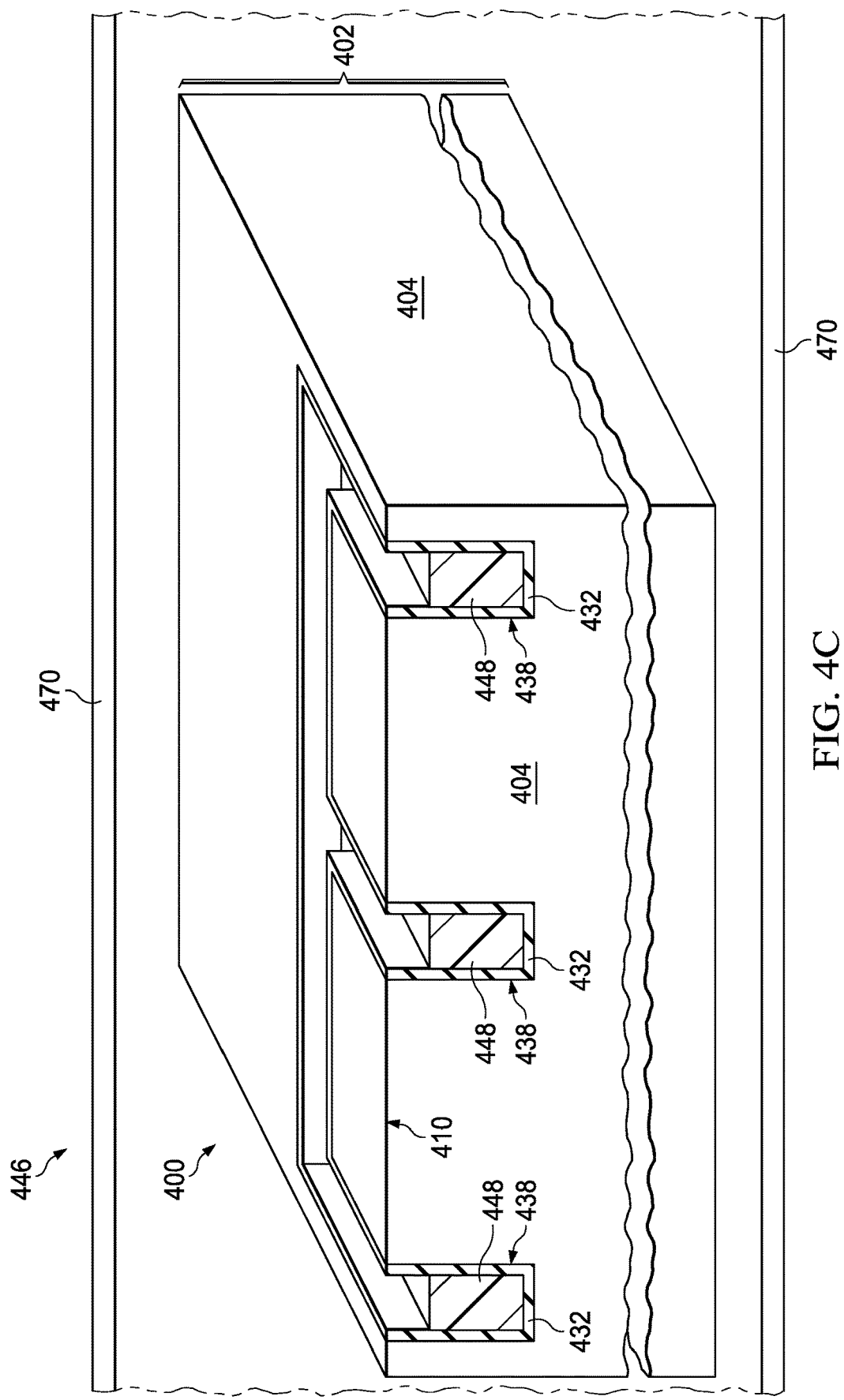

Referring to FIG. 4C, the nanoparticle ink film 444 of FIG. 4B is heated by a bake process 446 to remove at least a portion of a volatile material from the nanoparticle ink film 444 to form a nanoparticle film 448 which includes primarily nanoparticles. The bake process 446 may be a furnace process, as indicated schematically in FIG. 4C by furnace tube 470. Other bake processes are within the scope of the instant example.

Figure 4D:
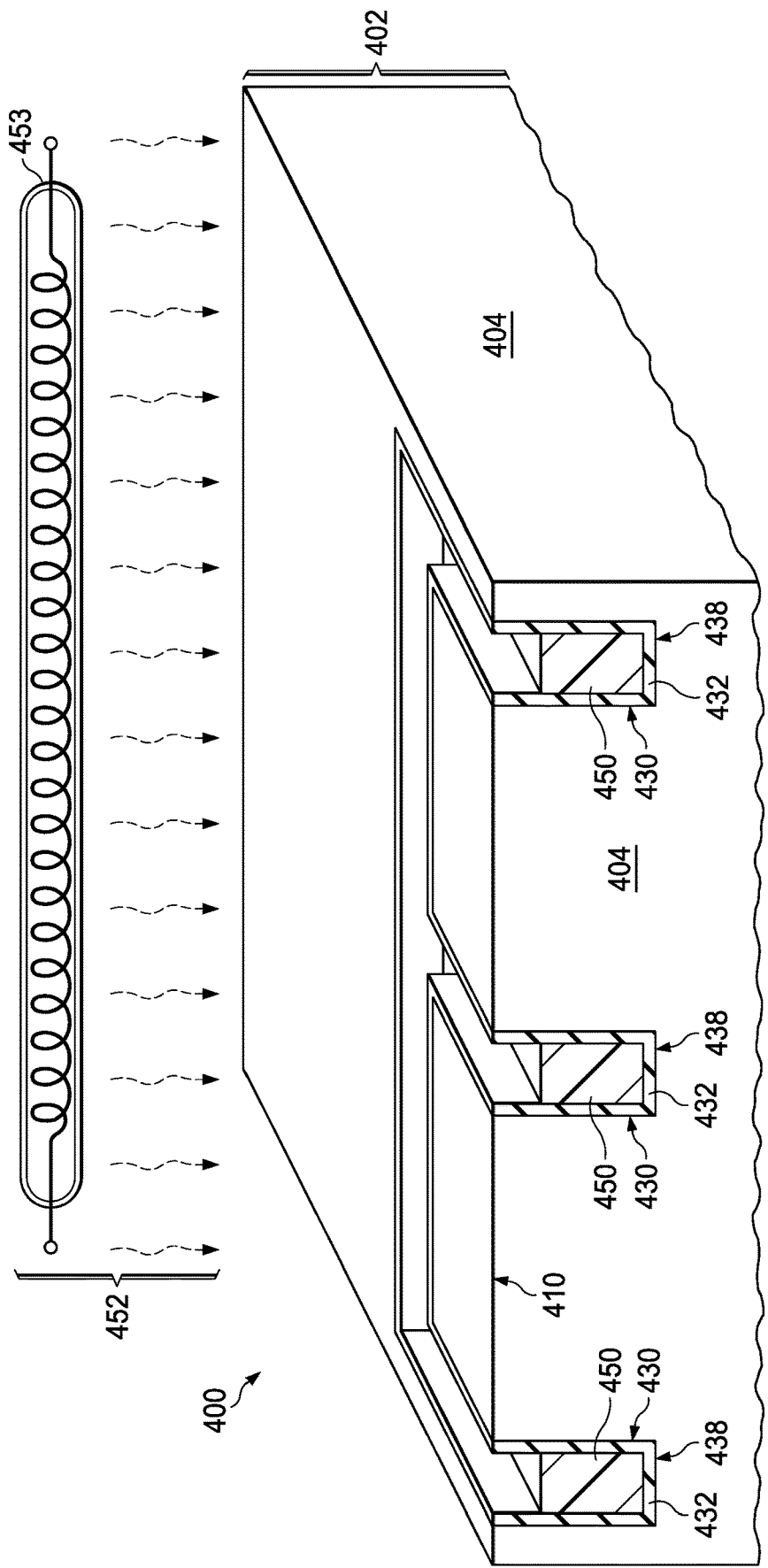

Referring to FIG. 4D, the nanoparticle film 448 of FIG. 4C is heated by a cohesion inducing process 452 so that adjacent nanoparticles cohere to each other, to form a cohered nanoparticle film 450 in the trench 438. The cohesion inducing process 452 may include a spike heating process, which provides radiant energy, commonly from an incandescent light source 453 as depicted in FIG. 4D. Other methods for inducing cohesion between adjacent nanoparticles in the cohered nanoparticle film 450 are within the scope of the instant example.

In the instant example, the cohered nanoparticle film 450 fills a lower portion of the trench, leaving space in the trench 438 for subsequently formed field oxide between a top surface of the cohered nanoparticle film 450 and the top surface 410 of the substrate 402. The cohered nanoparticle film 450 and the liner 432 provide a thermal routing trench 430.

Figure 4E:
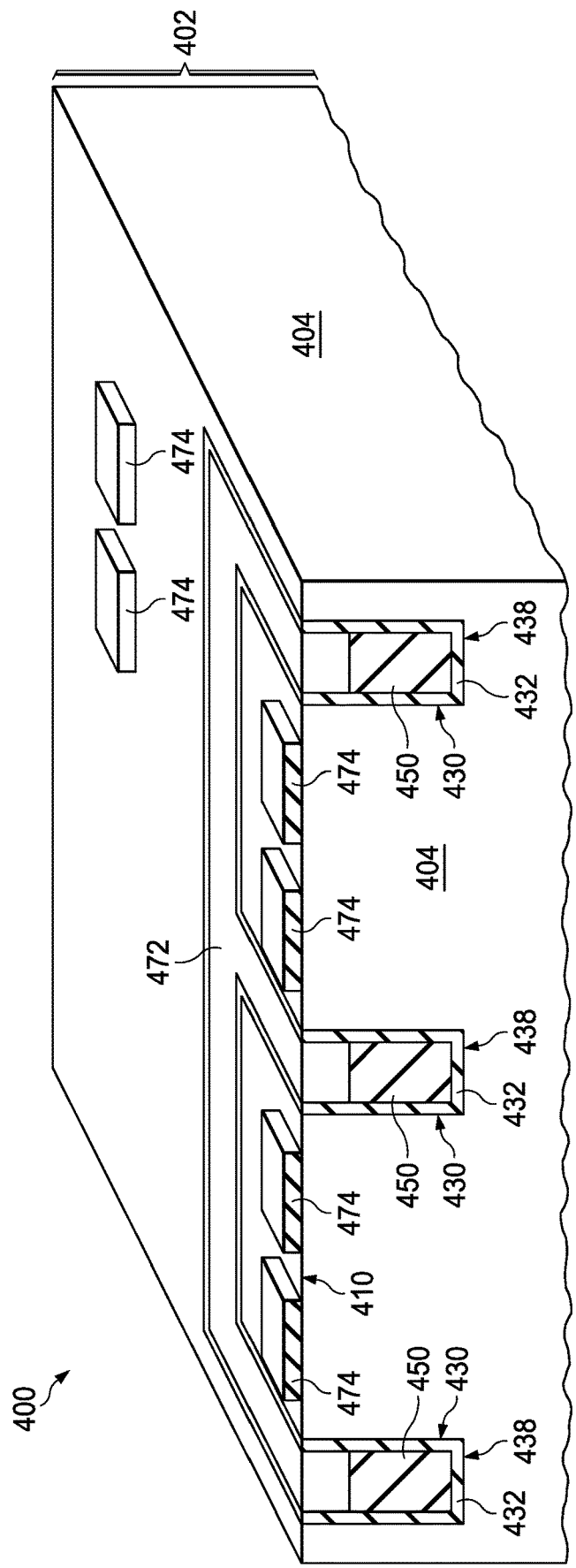

Referring to FIG. 4E, sacrificial material 472 is disposed over the cohered nanoparticle film 450. The sacrificial material 472 substantially fills the remaining portion of the trench 438, extending to proximate to the top surface 410 of the substrate 402. The sacrificial material 472 may include, for example, an organic resin such as novolac resin or polyisoprene resin. The sacrificial material 472 may be disposed in the trench 438 by a spin coat process, followed by a bake and an etchback process. Alternatively, the sacrificial material 472 may be disposed in the trench 438 by an additive process, which does not dispose the sacrificial material 472 outside of the trench 438. The sacrificial material 472 may be selected to have a similar etch rate as the semiconductor material 404 adjacent to the trench 438.

A trench mask 474 is formed over the substrate 402, exposing areas for field oxide. The trench mask 474 may include 50 nanometers to 200 nanometers of silicon nitride, and may include photoresist over the silicon nitride. In the instant example, the trench mask 474 may expose the sacrificial material 472 in the trench 438.

Figure 4F:
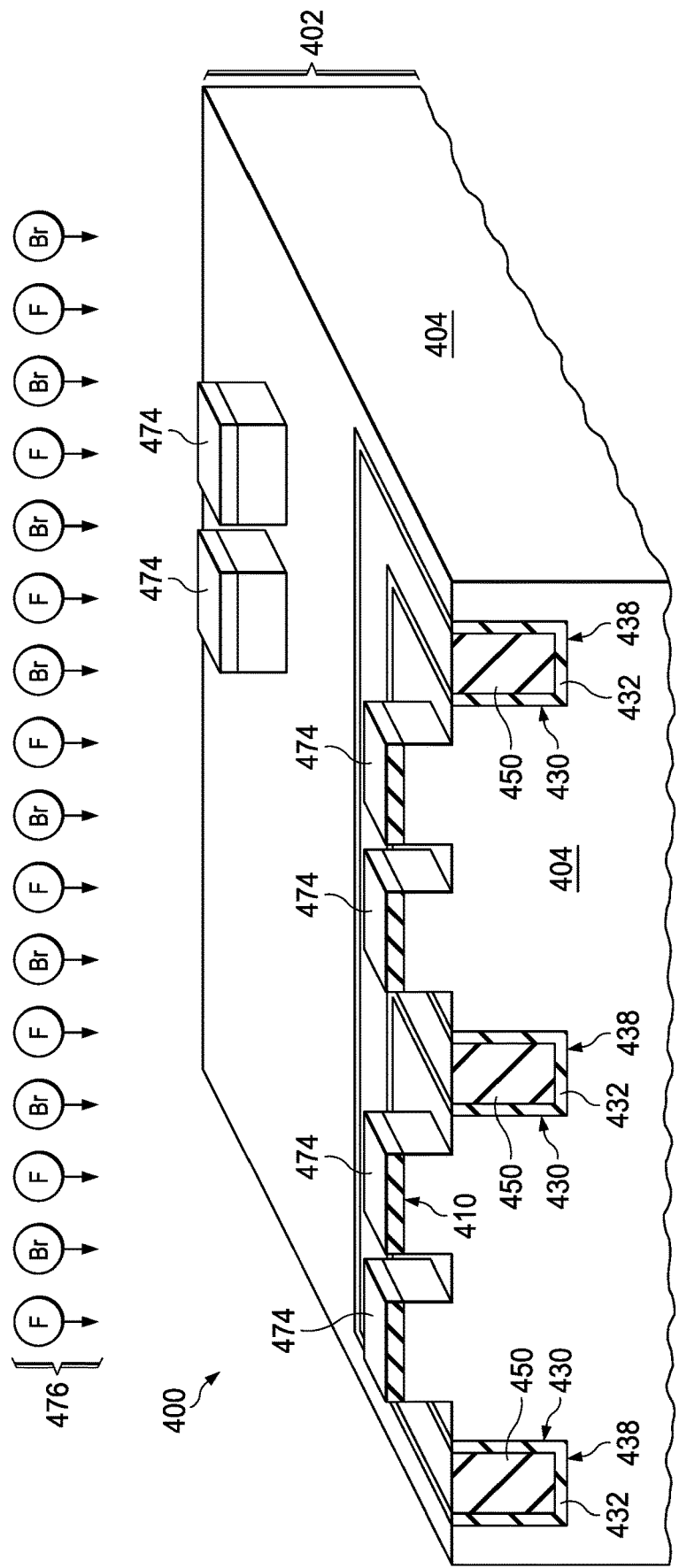

Referring to FIG. 4F, an etch process 476 is performed which removes the semiconductor material 404, the liner 432 and the sacrificial material 472 of FIG. 4E, in the areas exposed by the trench mask 474 down to a depth of 250 nanometers to 600 nanometers below the top surface 410 of the substrate 402. The etch process 476 may be an RIE process using halogen radicals such as fluorine and/or bromine, as indicated in FIG. 4F. Substantially all of the sacrificial material 472 is removed by the etch process 476. Little, if any, of the cohered nanoparticle film 450 may be removed by the etch process 476.

Figure 4G:
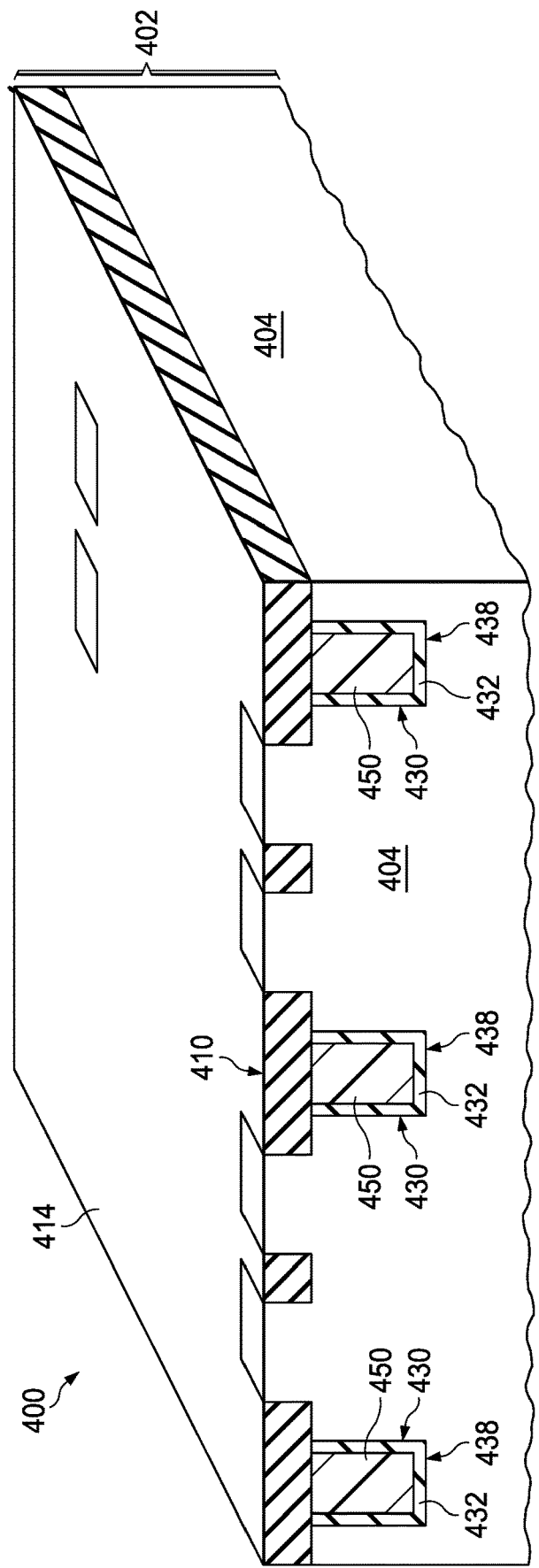

Referring to FIG. 4G, field oxide 414 is formed over the substrate 402 and over the thermal routing trench 430, in the areas exposed by the trench mask 474 of FIG. 4F. The field oxide 414 may be formed by a STI process, in which one or more layers of silicon dioxide-based dielectric material are formed over the substrate 402, cohered nanoparticle film 450 and trench mask 474. The silicon dioxide-based dielectric material is planarized, for example by an oxide chemical mechanical polish (CMP) process. The trench mask 474 is subsequently removed. The thermal routing trench 430 is thus disposed under the field oxide 414, which may facilitate subsequent fabrication steps of the integrated circuit 400 by isolating the cohered nanoparticle film 450 from etch processes and silicide formation processes.

Figure 5A:
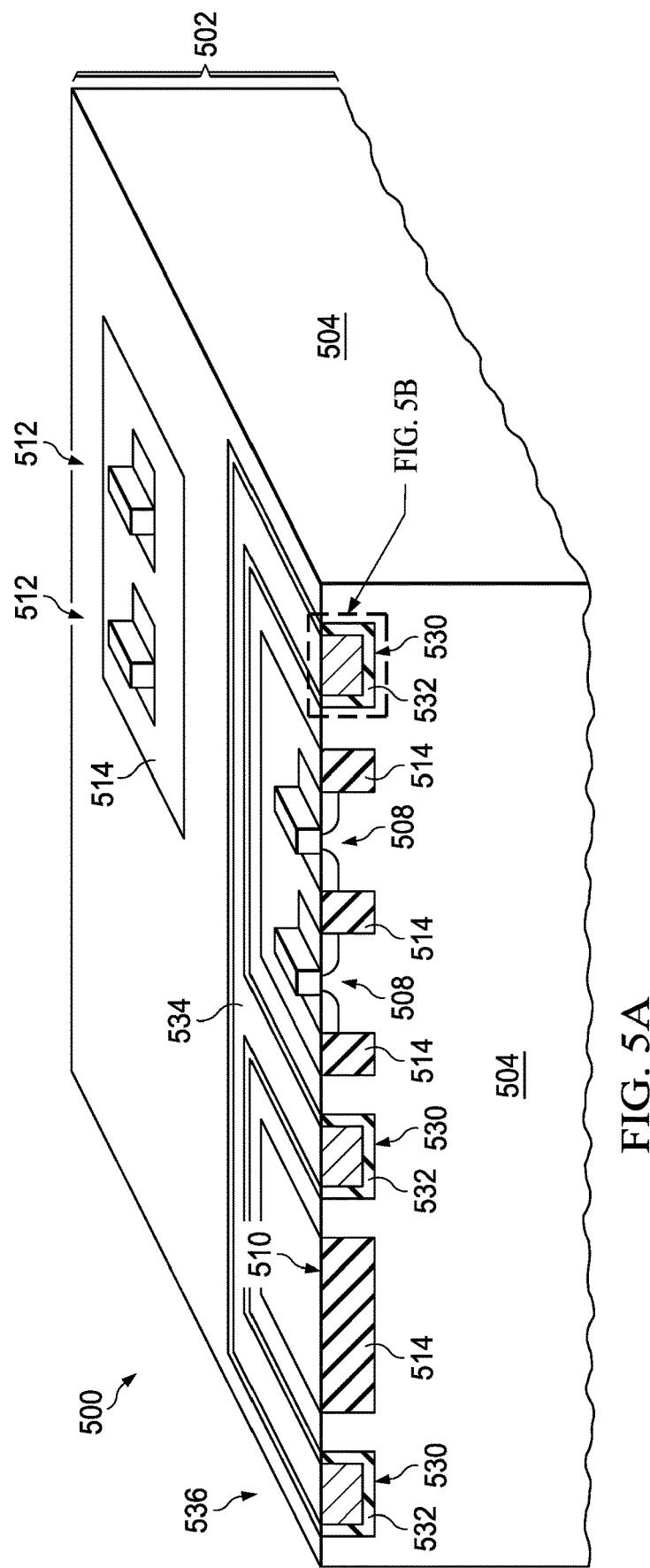
FIG. 5A and FIG. 5B are cross sections of yet another example integrated circuit containing a thermal routing trench according to an embodiment of the invention.
Figure 5B:
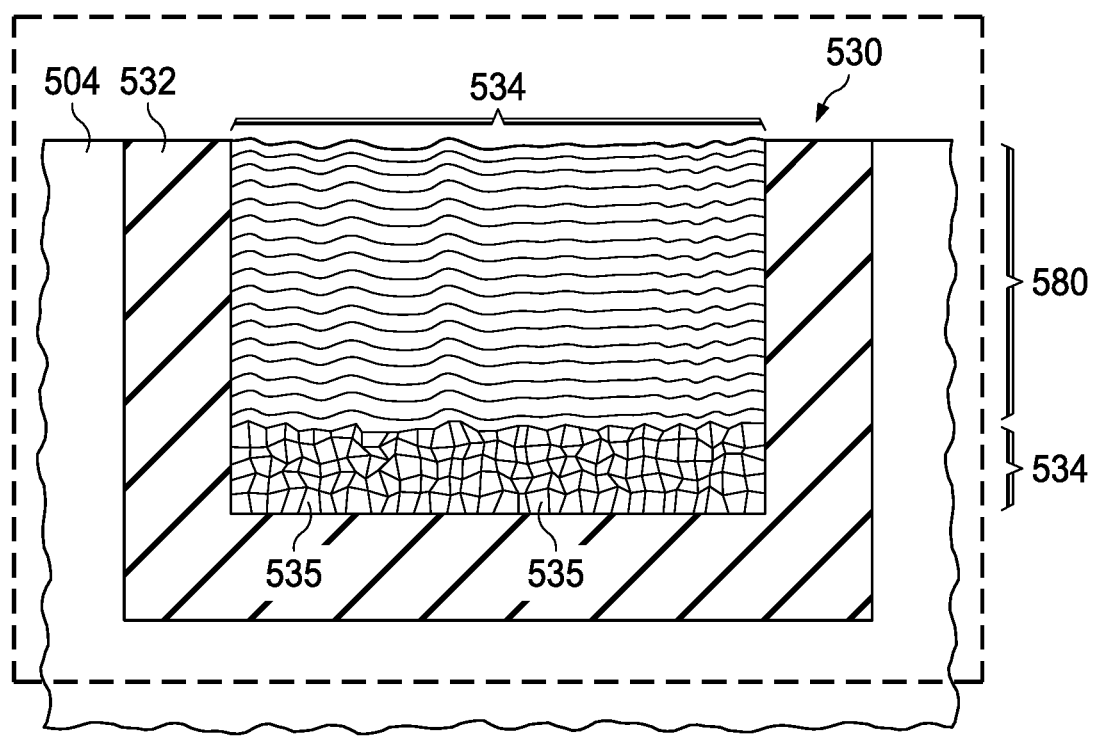

FIG. 5A and FIG. 5B are cross sections of yet another example integrated circuit containing a thermal routing trench according to an embodiment of the invention. Referring to FIG. 5A, the integrated circuit 500 includes a substrate 502 including a semiconductor material 504. The integrated circuit 500 further includes an interconnect region, not shown in FIG. 5A, disposed above the substrate 502. The interconnect region may be similar to the interconnect region 106 described in reference to FIG. 1A. In the instant example, heat-generating components 508 are disposed in the substrate 502 proximate to a top surface 510 of the substrate, which is also a boundary 510 between the substrate 502 and the interconnect region. The integrated circuit 500 may further include thermally sensitive components 512. The components 508 and 512 are depicted in FIG. 5A as MOS transistors, however other types of components are within the scope of the instant example. The components 508 and 512 may be laterally separated by field oxide 514 at the top surface 510 of the substrate 502.

A thermal routing trench 530 is disposed in the substrate 502. In the instant example, the thermal routing trench 530 extends to the top surface 510 of the substrate 502 and has a depth substantially equal to a depth of the field oxide 514. The thermal routing trench 530 extends over a portion, but not all, of the semiconductor material 504 outside the field oxide 514. The thermal routing trench 530 has a higher thermal conductivity than the semiconductor material 504 in the substrate 502 contacting the thermal routing trench 530. In the instant example, the thermal routing trench 530 includes a liner 532 of dielectric material which contacts the semiconductor material 504 of the substrate 502. The liner 532 may have substantially a same composition as dielectric material in the field oxide 514 abutting the semiconductor material 504 of the substrate 502. The thermal routing trench 530 includes a cohered nanoparticle film 534 which is separated from the semiconductor material 504 by the liner 532. The cohered nanoparticle film 534 includes primarily nanoparticles 535. Adjacent nanoparticles 535 are cohered to each other. The cohered nanoparticle film 534 is substantially free of an organic binder material such as adhesive or polymer. The nanoparticles 535 include catalyst metals suitable for forming graphitic material in a PECVD process. A layer of graphitic material 580 is disposed on the cohered nanoparticle film 534. The catalyst metals and the layer of graphitic material 580 may include the materials disclosed in reference to FIG. 1A and FIG. 1B. The thermal routing trench 530, including the liner 532, the cohered nanoparticle film 534 and the associated nanoparticles 535, and the layer of graphitic material 580, is shown in more detail in FIG. 5B.

The thermal routing trench 530 may laterally surround the heat-generating components 508 and extend to a heat removal region 536, as shown in FIG. 5A. The thermal routing trench 530 may be configured so as to extend away from the thermally sensitive components 512, as shown in FIG. 5A, advantageously diverting heat from the heat-generating components 508 away from the thermally sensitive components 512 during operation of the integrated circuit 500.

Figure 6A:
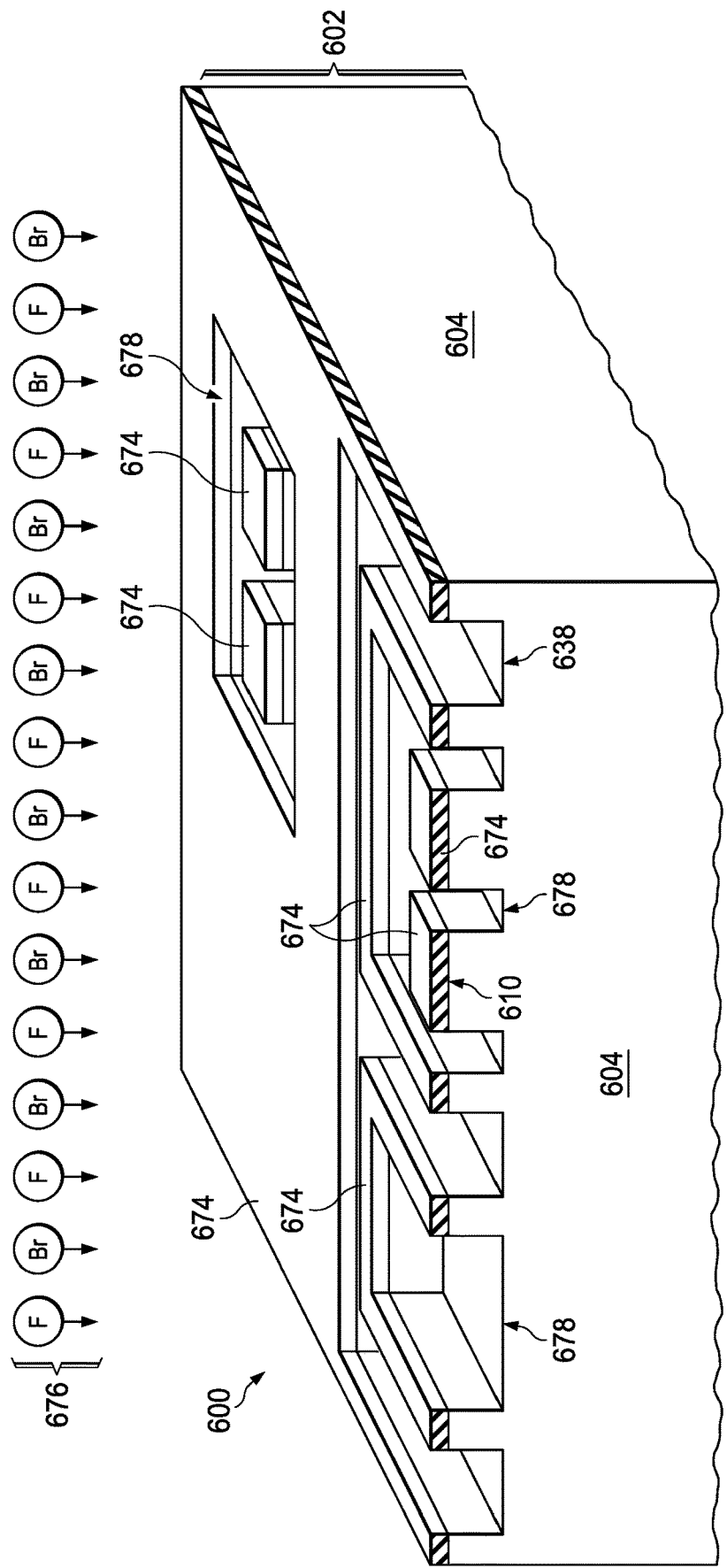

FIG. 6A through FIG. 6I depict an example method of forming an integrated circuit with a thermal routing trench of the type disclosed in reference to FIG. 5A and FIG. 5B according to an embodiment of the invention. Referring to FIG. 6A, the integrated circuit 600 is formed on a substrate 602 which includes a semiconductor material 604. A trench mask 674 is formed over a top surface 610 of the substrate 602. The trench mask 674 exposes areas for a thermal structure trench 638 and field oxide trenches 678. The trench mask 674 may include a layer of silicon nitride, and may include photoresist over the silicon nitride, as described in reference to the trench mask 474 of FIG. 4E.

An etch process 676 is performed which removes the semiconductor material 604 in the areas exposed by the trench mask 674 to concurrently form the thermal structure trench 638 and the field oxide trenches 678. The thermal structure trench 638 and the field oxide trenches 678 have substantially equal depths, for example 250 nanometers to 600 nanometers, below the top surface 610 of the substrate 602. The etch process 676 may be an RIE process using halogen radicals such as fluorine and/or bromine, as indicated in FIG. 6A. At least a portion of the trench mask 674 is left in place after the thermal structure trench 638 and the field oxide trenches 678 are formed.

Figure 6B:
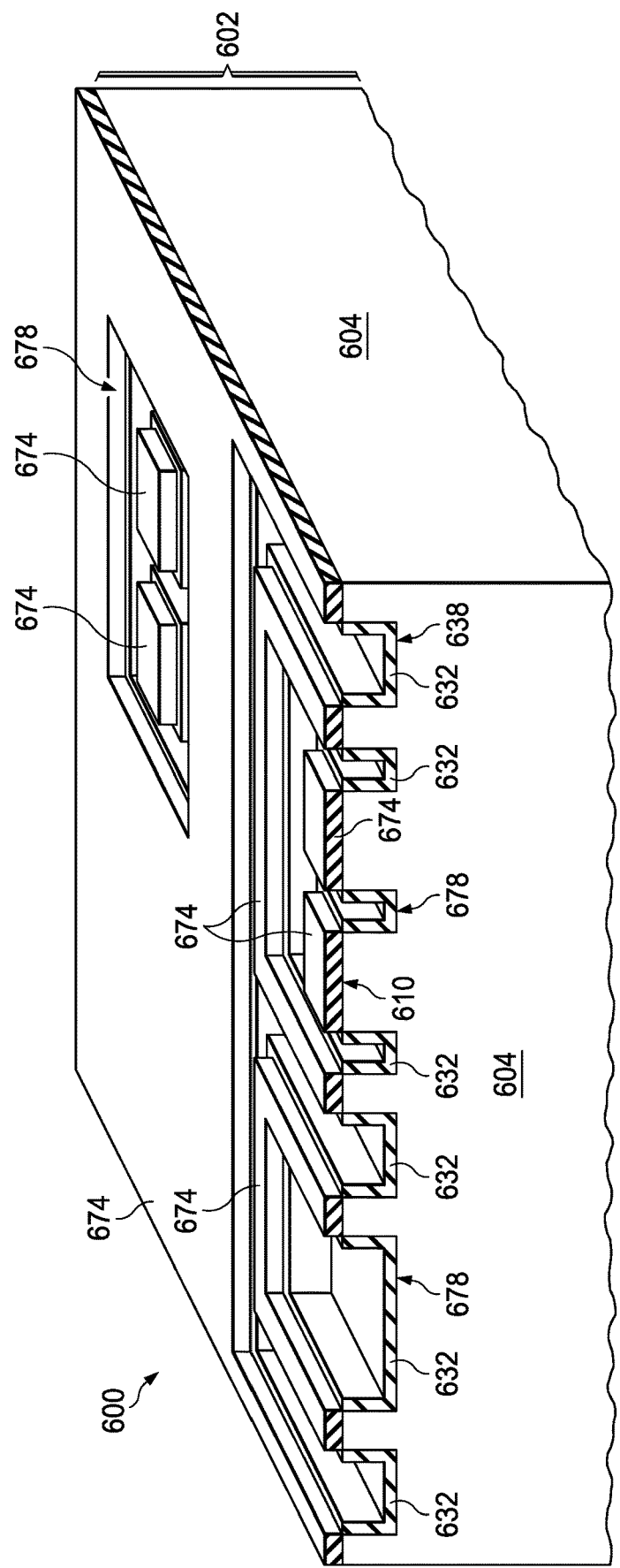

Referring to FIG. 6B, a liner 632 is formed in the thermal structure trench 638 and the field oxide trenches 678. The liner 632 abuts the semiconductor material 604. The liner 632 may include silicon dioxide formed by thermal oxidation of silicon in the semiconductor material 604. Alternatively, the liner 632 may include silicon dioxide and/or silicon nitride, and may be formed by a PECVD process.

Figure 6C:
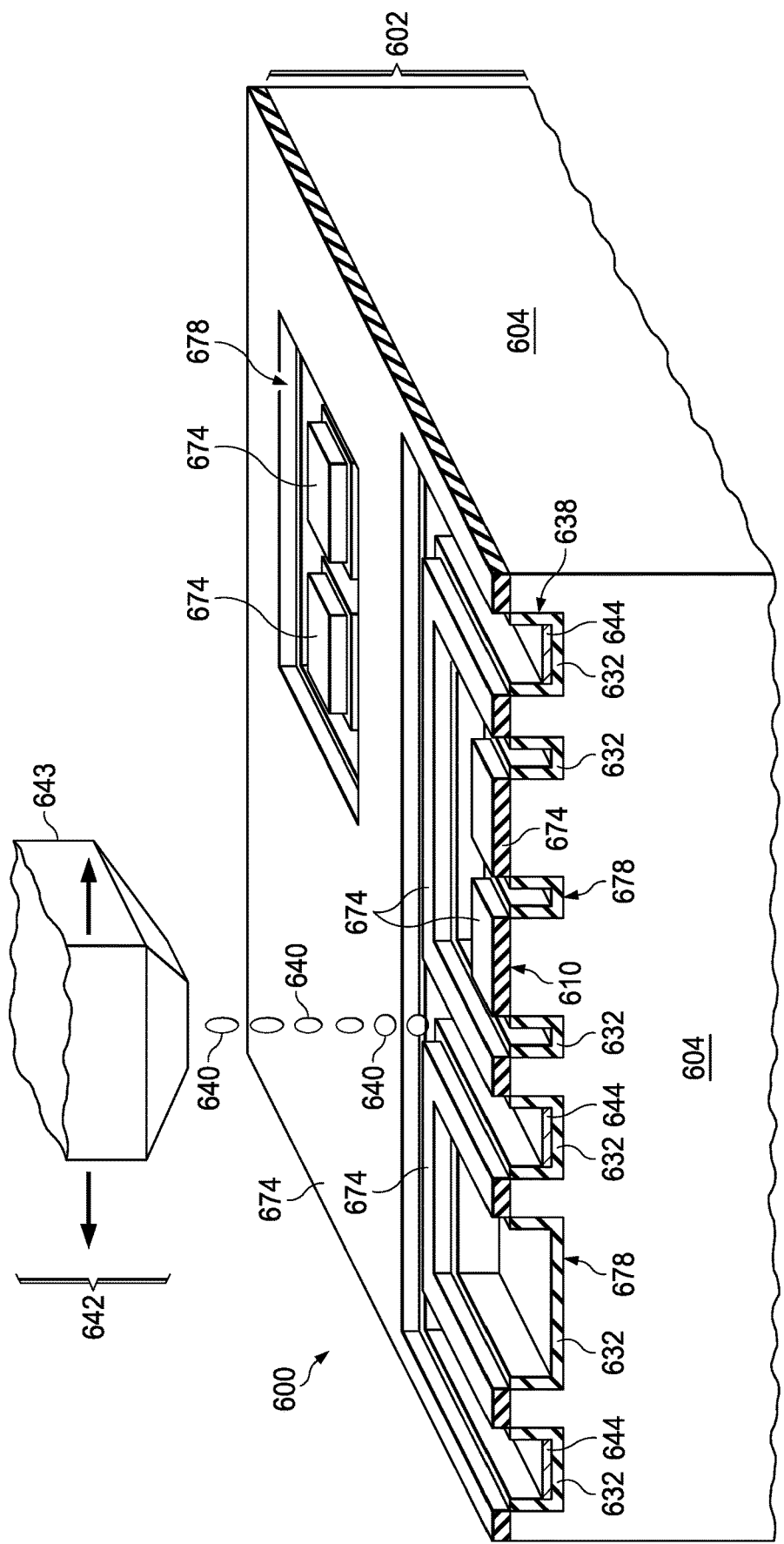

Referring to FIG. 6C, a nanoparticle ink film 644 containing nanoparticles is formed by an additive process 642 which dispenses a nanoparticle ink 640 onto the liner 632 in the thermal structure trench 638. The nanoparticle ink film 644 fills the thermal structure trench 638 partway, not completely. The nanoparticles include one or more metals suitable for a catalyst for subsequent growth of graphitic material. The nanoparticle ink film 644 is not formed in the field oxide trenches 678, nor over an instant top surface of the trench mask 674. The additive process 642 may include a discrete droplet process using a discrete droplet dispensing apparatus 643 such as an ink jet apparatus, as depicted schematically in FIG. 6C. Alternatively, the additive process 642 may be a direct laser transfer process, a continuous extrusion process, an electrostatic deposition process, or an electrochemical deposition process.

Figure 6D:
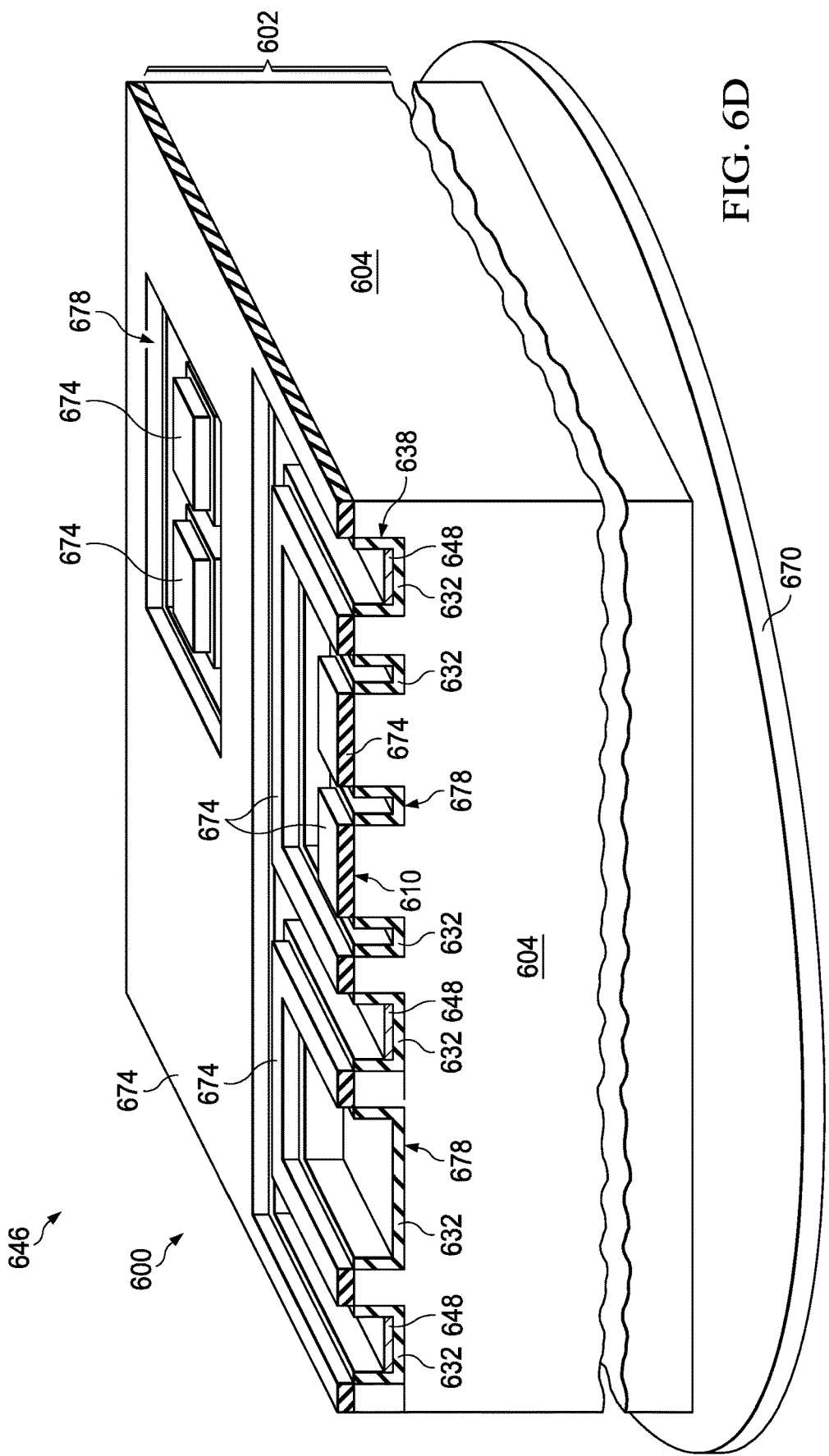

Referring to FIG. 6D, the nanoparticle ink film 644 of FIG. 6C may be heated by a bake process 646 using a hot plate 670 to remove at least a portion of a volatile material from the nanoparticle ink film 644 to form a nanoparticle film 648 which includes primarily nanoparticles. The nanoparticle film 648 is located in the thermal structure trench 638. Alternatively, the bake process 646 may be a radiant heat process or a furnace bake process.

Referring to FIG. 6E, the nanoparticle film 648 of FIG. 6D is heated by a cohesion inducing process 652 so that adjacent nanoparticles cohere to each other, to form a cohered nanoparticle film 650 in the thermal structure trench 638. The cohesion inducing process 652 may include a flash heating process, which provides radiant energy, for example from an flash tube 653 as depicted in FIG. 6E. The flash heating process 652 heats the nanoparticle film 648 for a time duration of, for example, 1 microsecond to 100 microseconds. Other methods for inducing cohesion between adjacent nanoparticles in the cohered nanoparticle film 650 are within the scope of the instant example. In the instant example, the cohered nanoparticle film 650 fills a lower portion of the trench, leaving space in the thermal structure trench 638 for subsequently formed graphitic material.

Figure 6F:
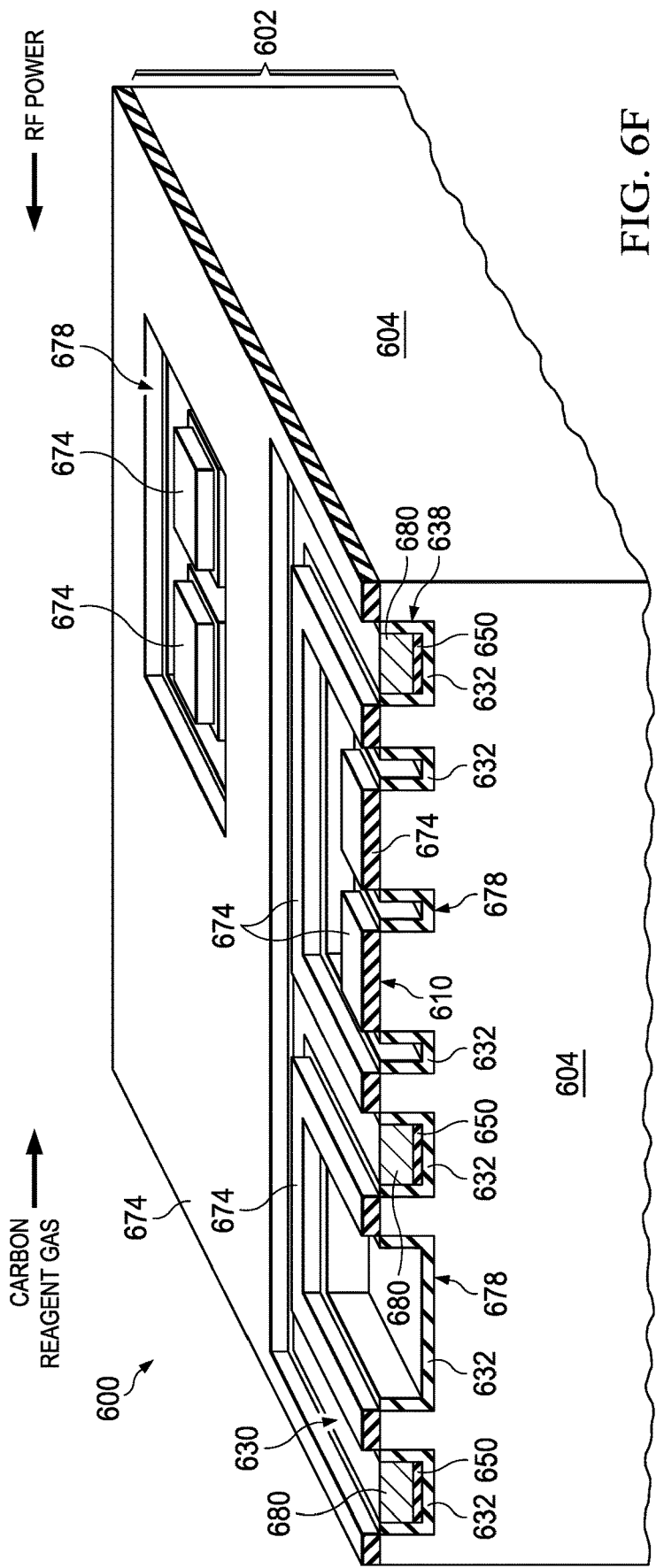

Referring to FIG. 6F, a layer of graphitic material 680 is selectively formed in the thermal structure trench 638 on the cohered nanoparticle film 650 by a graphitic material PECVD process. In the graphitic material PECVD process, the substrate 602 is heated, for example to a temperature of 200° C. to 400° C. A carbon-containing reagent gas, denoted in FIG. 6F as "CARBON REAGENT GAS" is flowed over the integrated circuit 600 and radio frequency (RF) power, denoted in FIG. 6F as "RF POWER" is applied to the carbon-containing reagent gas to generate carbon radicals above the integrated circuit 600. The carbon-containing reagent gas may include methane, straight chain alkanes such as ethane, propane and/or butane, alcohols such as ethanol, and/or cyclic hydrocarbons such as cyclobutane or benzene. Additional gases, such as hydrogen, argon and/or oxygen, may be flowed over the the integrated circuit 600. The metal in the nanoparticles in the cohered nanoparticle film 650 catalyze the carbon radicals to react to form the graphitic material 680, so that a first layer of the layer of graphitic material 680 is formed selectively on the cohered nanoparticle film 650. Subsequent layers of the graphitic material 680 are formed selectively on the previously formed layers of graphitic material 680, so that the layer of graphitic material 680 is formed selectively on the cohered nanoparticle film 650, and the graphitic material 680 is not formed on the integrated circuit 600 outside of the cohered nanoparticle film 650. The combined liner 632, the cohered nanoparticle film 650 and the layer of graphitic material 680 provide the thermal routing trench 630.

Referring to FIG. 6G, a fill layer 682 of dielectric material is formed over the trench mask 674, the thermal routing trench 630 and on the liner 632 in the field oxide trenches 678. The fill layer 682 may include one or more layers of silicon dioxide-based dielectric material. The fill layer 682 may be formed by, for example, an APCVD process, a PECVD process, a high aspect ratio process (HARP) using tetraethyl orthosilicate (TEOS) and ozone, or a high density plasma (HDP) process. The fill layer 682 may be formed by alternating deposition steps and etchback steps to provide a desired degree of planarity of a top surface of the fill layer 682.

Figure 6H:
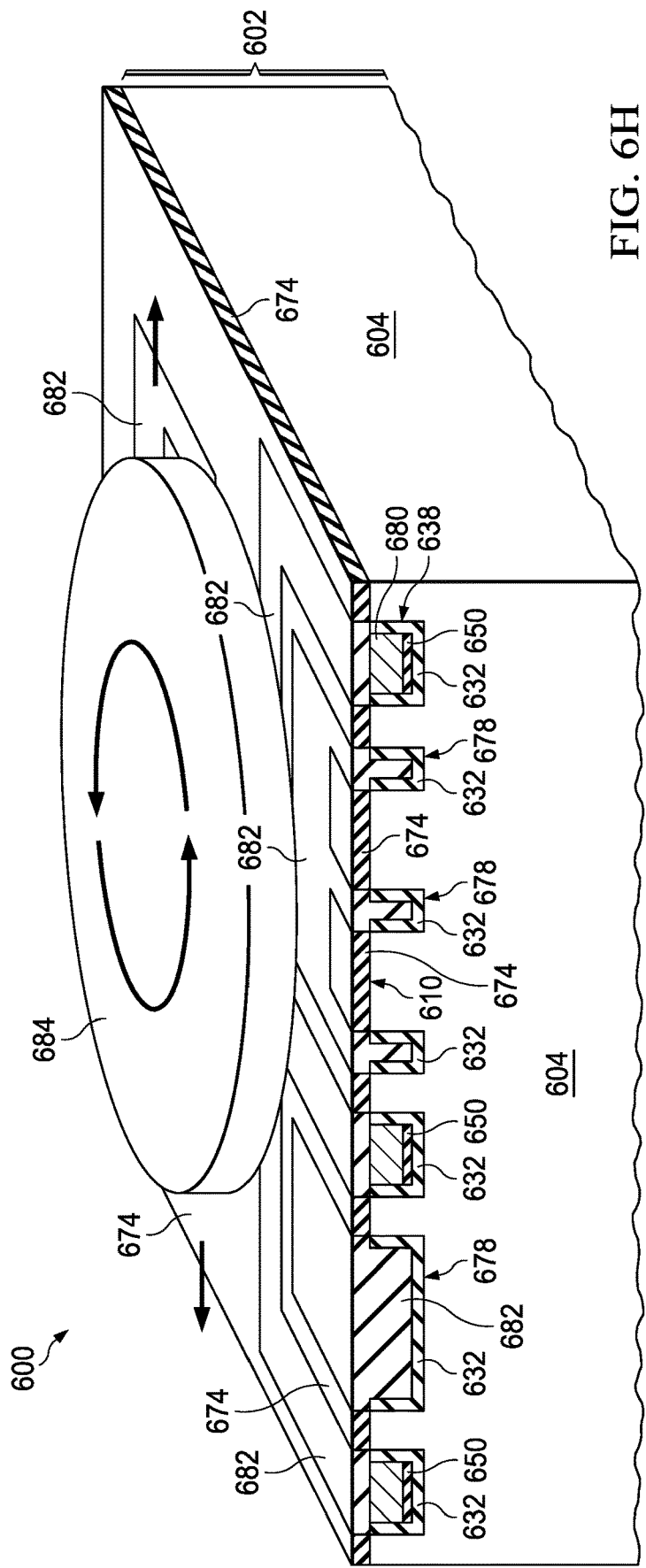

Referring to FIG. 6H, the fill layer 682 over the trench mask 674 is removed, for example by an oxide CMP process, depicted schematically in FIG. 6H by a CMP pad 684, or possibly by an etchback process. A portion of the fill layer 682 may be left over the thermal routing trench 630, as depicted in FIG. 6H. Alternatively, the fill layer 682 may optionally be removed from over the thermal routing trench 630 during the process to remove the fill layer 682 over the trench mask 674. The trench mask 674 is subsequently removed, for example by a wet etch. Silicon nitride in the trench mask 674 may be removed by an aqueous phosphoric acid solution, for example.

Figure 6I:
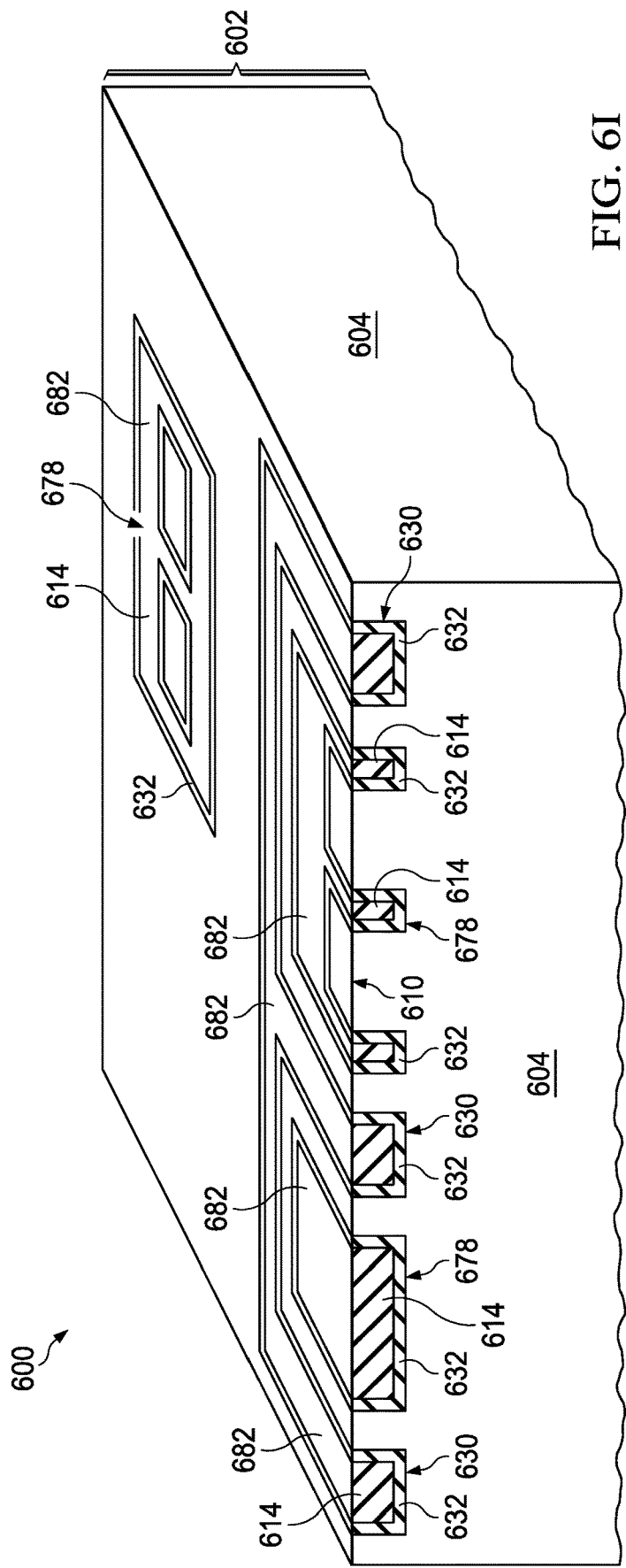

Referring to FIG. 6I, the liner 632 in the field oxide trenches 678 combined with the fill layer 682 in the field oxide trenches 678 provide the field oxide 614, which has an STI configuration. Formation of the integrated circuit 600 continues with formation of active components such as transistors, including heat-generating components, in the substrate 602, followed by formation of an interconnect region over the active components and over the top surface 610 of the substrate 602. Forming the thermal routing trench 630 to have a same depth as the field oxide 614 may enable locating the thermal routing trench close to the heat-generating components, not shown in FIG. 6I, without interfering in doped wells, such as p-type wells and n-type wells, containing the heat-generating components.

Figure 7:
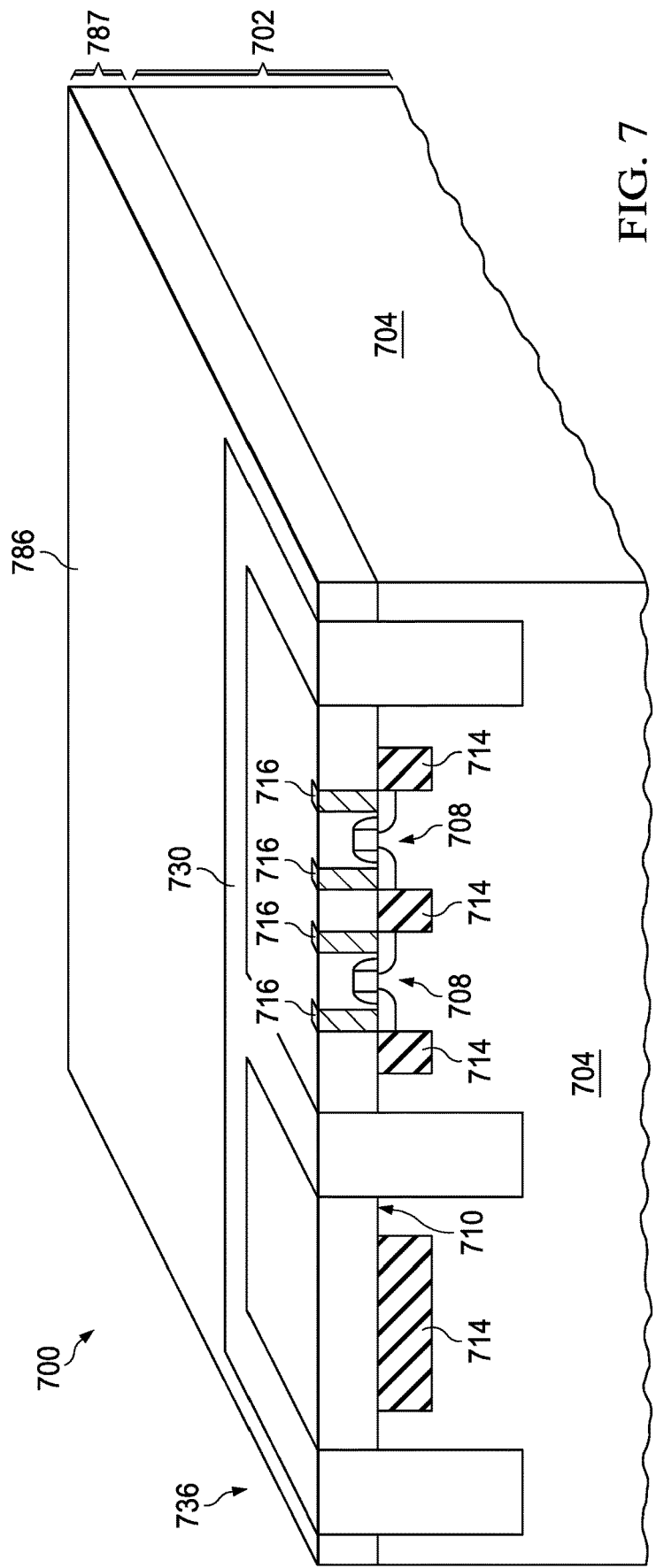
FIG. 7 is a cross section of a further example integrated circuit containing a thermal routing trench according to an embodiment of the invention.

FIG. 7 is a cross section of a further example integrated circuit containing a thermal routing trench according to an embodiment of the invention. The integrated circuit 700 includes a substrate 702 including a semiconductor material 704. The integrated circuit 700 further includes a pre-metal dielectric (PMD) layer 786 of an interconnect region 787 disposed above the substrate 702. The interconnect region may be similar to the interconnect region 106 described in reference to FIG. 1A. Active components 708, depicted in FIG. 7 as MOS transistors, are disposed in the substrate 702, proximate to a boundary 710 between the substrate 702 and the interconnect region 787. Field oxide 714 may be disposed in the substrate 702. Contacts 716 are disposed through the PMD layer 786 and make electrical connections to the active components 708.

In the instant example, a thermal routing trench 730 is disposed through the PMD layer 786 and extends into the substrate 702. The thermal routing trench 730 may have a structure as described in any of the examples disclosed herein. The thermal routing trench 730 may be formed by etching a trench through the PMD layer 786 and into the substrate 702, followed by forming a nanoparticle region in the trench by an additive process. The thermal routing trench 730 may surround the active components 708, and may extend to a heat removal region 736 of the integrated circuit 700. Other spatial configurations of the thermal routing trench 730 are within the scope of the instant example. The interconnect region includes a plurality dielectric layers, interconnects, and vias, formed over the PMD layer 786. The plurality dielectric layers, interconnects, and vias of the interconnect region are not shown in FIG. 7 to more clearly depict the configuration of the thermal routing trench 730 with respect to the PMD layer 786. Forming the thermal routing trench 730 to extend through the PMD layer 786 and into the substrate 702 may improve heat transfer from the active components 708 to the heat removal region 736, through the thermal routing trench 730.

FIG. 8 is a cross section of an example integrated circuit which includes a combined thermal routing trench according to an embodiment of the invention. The integrated circuit 800 includes a substrate 802 including a semiconductor material 804. The integrated circuit 800 further includes an interconnect region 806 disposed above the substrate 802. Heat-generating components 808 are disposed in the substrate 802 and the interconnect region 806, at a boundary 810 between the substrate 802 and the interconnect region 806. The heat-generating components 808 may be, for example, MOS transistors, bipolar junction transistors, JFETs, resistors, and/or SCRs. The heat-generating components 808 may be laterally separated by field oxide 814 at the boundary 810 between the substrate 802 and the interconnect region 806. The interconnect region 806 may include contacts 816, interconnects 818 and vias 820 disposed in a dielectric layer stack 822. Some of the interconnects 818 are disposed in a top interconnect level 888 which is located at a top surface 824 of the interconnect region 806. The top surface 824 of the interconnect region 806 is located opposite from the boundary 810 between the substrate 802 and the interconnect region 806. Bond pad structures 828 are disposed over the top surface 824 of the interconnect region 806, and are electrically coupled to the interconnects 818 in the top interconnect level 888. A protective overcoat 826 is disposed over the top surface 824 of the interconnect region 806.

In the instant example, the integrated circuit 800 is assembled using wire bonds 890 on some of the bond pad structures 828. The integrated circuit 800 is packaged by encapsulation in an encapsulation material 892. The encapsulation material 892, which may be an epoxy for example, is disposed over the protective overcoat 826 and the bond pad structures 828.

The integrated circuit 800 of the instant example includes the combined thermal routing structure 894, which extends from inside the substrate 802 through the interconnect region 806, and through the organic polymer encapsulation material 892. The combined thermal routing structure 894 may conduct heat generated by the components 808 to a heat removal apparatus, such as a heat sink, located outside of a package containing the integrated circuit 800, which may advantageously reduce an operating temperature of the components 808. The combined thermal routing structure 894 includes a thermal routing trench 830 disposed in the substrate 802 according to any of the examples disclosed herein.

The combined thermal routing structure 894 may include an interconnect region thermal routing structure 896 disposed in the interconnect region 806. The interconnect region thermal routing structure 896 may surround a portion of the components 808 and may be connected to each other at locations out of the plane of FIG. 8. The interconnect region thermal routing structure 896 may have a structure and may be formed, for example, as described in the commonly assigned patent application having patent application Ser. No. 15/361,394, filed simultaneously with this application, and which is incorporated herein by reference.

The combined thermal routing structure 894 may include high thermal conductivity vias 898 disposed in the interconnect region 806. The high thermal conductivity vias 898 may surround a portion of the components 808 and may be connected to each other at locations out of the plane of FIG. 8. The high thermal conductivity vias 898 may have structures and may be formed, for example, as described in the commonly assigned patent application having patent application Ser. No. 15/361,399, filed simultaneously with this application, and which is incorporated herein by reference.

The combined thermal routing structure 894 may include a top level thermal conductivity structure 900 disposed above the interconnect region 806. The top level thermal conductivity structure 900 may have a structure and may be formed, for example, as described in the commonly assigned patent application having patent application Ser. No. 15/361,390, filed simultaneously with this application, and which is incorporated herein by reference.

The combined thermal routing structure 894 may include high thermal conductivity through-package conduits 902 disposed through the encapsulation material 892 to the integrated circuit 800. The high thermal conductivity through-package conduits 902 may have structures and may be formed, for example, as described in the commonly assigned patent application having patent application Ser. No. 15/361,403, filed simultaneously with this application, and which is incorporated herein by reference.

The integrated circuit 800 may further include graphitic vias 904 which are electrically coupled to the components 808. The graphitic vias 904 may conduct heat generated by the components 808 away from the substrate, possibly to the combined thermal routing structure 894, which may advantageously reduce an operating temperature of the components 808. The graphitic vias 904 may have structures and may be formed, for example, as described in the commonly assigned patent application having patent application Ser. No. 15/361,401, filed simultaneously with this application, and which is incorporated herein by reference.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a substrate including semiconductor material;
   an interconnect region above the substrate;
   a heat generating component in the substrate; and
   a thermal routing trench in the substrate, the substrate extending under the thermal routing trench, the interconnect region extending over the thermal routing trench, the thermal routing trench located proximate the heat generating component, and the thermal routing trench including a nanoparticle film including nanoparticles, in which adjacent nanoparticles are cohered to each other, and the thermal routing trench has a thermal conductivity higher than the semiconductor material contacting the thermal routing trench, and the thermal routing trench extends to a heat removal region of the integrated circuit.

2. The integrated circuit of claim 1, wherein the thermal routing trench includes a liner of dielectric material contacting the semiconductor material adjacent the thermal routing trench, and the nanoparticle film is separated from the semiconductor material by the liner.

3. The integrated circuit of claim 1, wherein the nanoparticles include a material selected from a group consisting of aluminum oxide, diamond, hexagonal boron nitride, cubic boron nitride, aluminum nitride, metal, graphene, graphene embedded in metal, graphite, graphitic carbon, and carbon nanotubes.

4. The integrated circuit of claim 1, wherein the nanoparticles include a metal selected from a group consisting of copper, nickel, palladium, platinum, iridium, rhodium, cerium, osmium, molybdenum, and gold, and the thermal routing trench includes a layer of graphitic material on the nanoparticle film.

5. The integrated circuit of claim 1, wherein the thermal routing trench extends away from a thermally sensitive component of the integrated circuit.

6. The integrated circuit of claim 1, wherein the thermal routing trench extends proximate to matching components of the integrated circuit.

7. The integrated circuit of claim 1, wherein the thermal routing trench extends to a boundary between the substrate and the interconnect region.

8. The integrated circuit of claim 1, wherein the thermal routing trench extends into the interconnect region.

9. The integrated circuit of claim 1, wherein the nanoparticle film is a first nanoparticle film, and the integrated circuit further comprises a thermal routing component selected from a group consisting of a high thermal conductivity via, an interconnect region thermal routing structure, a top level thermal conductivity structure above the interconnect region, a high thermal conductivity through package conduit, and a graphitic via, in which:
   the high thermal conductivity via includes a second nanoparticle film, and the high thermal conductivity via is above the interconnect region;
   the interconnect region thermal routing structure includes a third nanoparticle film, and the interconnect region thermal routing structure is in the interconnect region;
   the top level thermal conductivity structure above the interconnect region includes a fourth nanoparticle film;
   the high thermal conductivity through package conduit includes a fifth nanoparticle film, and the high thermal conductivity through package conduit is through an encapsulation material over the integrated circuit and extends to the integrated circuit; and
   the graphitic via includes a sixth nanoparticle film, and the graphitic via is electrically coupled to one of multiple components.

* * * * *